(12) United States Patent
Venkatasubramanian

(10) Patent No.: US 7,638,705 B2
(45) Date of Patent: Dec. 29, 2009

(54) THERMOELECTRIC GENERATORS FOR SOLAR CONVERSION AND RELATED SYSTEMS AND METHODS

(75) Inventor: Rama Venkatasubramanian, Cary, NC (US)

(73) Assignee: Nextreme Thermal Solutions, Inc., Durham, NC (US)

(*) Notice: Subject to any disclaimer, the term of this patent is extended or adjusted under 35 U.S.C. 154(b) by 781 days.

(21) Appl. No.: 11/406,100

(22) Filed: Apr. 18, 2006

(65) Prior Publication Data
US 2006/0243317 A1    Nov. 2, 2006

Related U.S. Application Data

(63) Continuation-in-part of application No. PCT/US2004/041431, filed on Dec. 13, 2004.

(60) Provisional application No. 60/528,479, filed on Dec. 11, 2003, provisional application No. 60/672,330, filed on Apr. 18, 2005.

(51) Int. Cl.
*H01L 35/00* (2006.01)
(52) U.S. Cl. .................... 136/206; 136/205
(58) Field of Classification Search .......... 136/206, 136/205
See application file for complete search history.

(56) References Cited

U.S. PATENT DOCUMENTS

| | | | |
|---|---|---|---|
| 2,984,696 A | 5/1961 | Shaffer | |
| 3,088,989 A | 5/1963 | Lipkis | |
| 3,136,134 A | 6/1964 | Smith | |
| 3,296,034 A | 1/1967 | Reich | |
| 3,607,444 A | 9/1971 | Debucs | |
| 3,663,307 A | 5/1972 | Mole | |
| 4,008,709 A * | 2/1977 | Jardine | 126/610 |
| 4,106,952 A * | 8/1978 | Kravitz | 136/206 |
| 4,238,759 A | 12/1980 | Hunsperger | |
| 4,279,292 A | 7/1981 | Swiatosz | |
| 4,443,650 A | 4/1984 | Takagi et al. | |
| 5,006,178 A | 4/1991 | Bijvoets | |
| 5,012,325 A | 4/1991 | Mansuria et al. | |
| 5,254,178 A | 10/1993 | Yamada et al. | |
| 5,362,983 A | 11/1994 | Yamamura et al. | |

(Continued)

FOREIGN PATENT DOCUMENTS

DE    36 19 327 A1    12/1987

(Continued)

OTHER PUBLICATIONS

US 6,381,965, 5/2002, Ghoshal (withdrawn).

(Continued)

*Primary Examiner*—Jeffrey T. Barton
(74) *Attorney, Agent, or Firm*—Myers Bigel Sibley & Sajovec, P.A.

(57) ABSTRACT

A thermoelectric generator may include first and second thermally conductive plates and a plurality of pairs of P-type and N-type thermoelectric elements. The first thermally conductive plate may be configured to generate heat responsive to solar radiation, and the first and second thermally conductive plates may be spaced apart. The P-type and N-type thermoelectric elements of each pair may be electrically coupled in series, and the P-type and N-type thermoelectric elements of each pair may be thermally coupled in parallel between the first and second thermally conductive plates.

14 Claims, 26 Drawing Sheets

U.S. PATENT DOCUMENTS

| | | |
|---|---|---|
| 5,419,780 A | 5/1995 | Suski |
| 5,430,322 A | 7/1995 | Koyanagi et al. |
| 5,712,448 A | 1/1998 | Vandersande et al. |
| 5,837,929 A | 11/1998 | Adelman |
| 5,865,975 A | 2/1999 | Bishop |
| 5,869,242 A | 2/1999 | Kamb |
| 5,874,219 A | 2/1999 | Rava et al. |
| 5,900,071 A | 5/1999 | Harman |
| 5,922,988 A | 7/1999 | Nishimoto |
| 6,060,331 A | 5/2000 | Shakouri et al. |
| 6,060,657 A | 5/2000 | Harman |
| 6,062,681 A | 5/2000 | Field et al. |
| 6,071,351 A | 6/2000 | Venkatasubramanian |
| 6,072,925 A | 6/2000 | Sakata |
| 6,084,050 A | 7/2000 | Ooba et al. |
| 6,094,919 A | 8/2000 | Bhatia |
| 6,154,266 A | 11/2000 | Okamoto et al. |
| 6,154,479 A | 11/2000 | Yoshikawa et al. |
| 6,180,351 B1 | 1/2001 | Cattell |
| 6,196,002 B1 | 3/2001 | Newman et al. |
| 6,271,459 B1 | 8/2001 | Yoo |
| 6,282,907 B1 | 9/2001 | Ghoshal |
| 6,300,150 B1 | 10/2001 | Venkatasubramanian |
| 6,323,414 B1 | 11/2001 | Shakouri et al. |
| 6,365,821 B1 | 4/2002 | Prasher |
| 6,384,312 B1 | 5/2002 | Ghoshal et al. |
| 6,403,876 B1 | 6/2002 | Ghoshal et al. |
| 6,410,971 B1 | 6/2002 | Otey |
| 6,412,286 B1 | 7/2002 | Park et al. |
| 6,417,060 B2 | 7/2002 | Tavkhelidze et al. |
| 6,424,533 B1 | 7/2002 | Chu et al. |
| 6,505,468 B2 | 1/2003 | Venkatasubramanian |
| 6,557,354 B1 | 5/2003 | Chu et al. |
| 6,605,772 B2 | 8/2003 | Harman et al. |
| 6,619,045 B1 | 9/2003 | Clark |
| 6,625,991 B1 | 12/2003 | Venkatasubramanian |
| 6,658,858 B1 | 12/2003 | Clark |
| 6,662,570 B2 | 12/2003 | Thompson et al. |
| 6,696,635 B2 | 2/2004 | Prasher |
| 6,722,140 B2 | 4/2004 | Venkatasubramanian |
| 6,733,605 B1 | 5/2004 | Lamping et al. |
| 6,787,691 B2 | 9/2004 | Fleurial et al. |
| 6,826,916 B2 | 12/2004 | Shimada |
| 6,867,978 B2 | 3/2005 | Whittenburg et al. |
| 7,005,320 B2 | 2/2006 | Kwon |
| 7,005,738 B2 | 2/2006 | Zuo et al. |
| 7,009,289 B2 | 3/2006 | Hu et al. |
| 7,038,316 B2 | 5/2006 | Hu et al. |
| 7,164,077 B2 | 1/2007 | Venkatasubramanian et al. |
| 7,235,735 B2 | 6/2007 | Venkatasubramanian |
| 2001/0013224 A1 | 8/2001 | Ohkubo et al. |
| 2001/0052234 A1 | 12/2001 | Venkatasubramanian |
| 2002/0017102 A1 | 2/2002 | Bell |
| 2002/0053359 A1 | 5/2002 | Harman et al. |
| 2002/0062648 A1 | 5/2002 | Ghoshal |
| 2002/0069906 A1 | 6/2002 | Macris |
| 2002/0071222 A1 | 6/2002 | Ghoshal |
| 2002/0071223 A1 | 6/2002 | Ghoshal |
| 2002/0092307 A1 | 7/2002 | Ghoshal |
| 2002/0092557 A1 | 7/2002 | Ghoshal |
| 2002/0095243 A1 | 7/2002 | Ghoshal |
| 2002/0113289 A1 | 8/2002 | Cordes et al. |
| 2002/0139123 A1 | 10/2002 | Bell |
| 2002/0166839 A1 | 11/2002 | Ghoshal et al. |
| 2002/0174660 A1 | 11/2002 | Venkatasubramanian |
| 2003/0099279 A1 | 5/2003 | Venkatasubramanian |
| 2003/0100137 A1 | 5/2003 | Venkatasubramanian |
| 2003/0111516 A1 | 6/2003 | Ghoshal |
| 2003/0112844 A1 | 6/2003 | Cordes et al. |
| 2003/0113950 A1 | 6/2003 | Cooper et al. |
| 2003/0126865 A1 | 7/2003 | Venkatasubramanian |
| 2003/0131609 A1 | 7/2003 | Venkatasubramanian |
| 2003/0156623 A1 | 8/2003 | Cordes et al. |
| 2003/0169798 A1 | 9/2003 | Cordes et al. |
| 2003/0186471 A1 | 10/2003 | Shi et al. |
| 2003/0230332 A1 | 12/2003 | Venkatasubramanian et al. |
| 2004/0018729 A1 | 1/2004 | Ghoshal et al. |
| 2004/0028117 A1 | 2/2004 | Cordes et al. |
| 2004/0118129 A1 | 6/2004 | Chrysler et al. |
| 2004/0182088 A1 | 9/2004 | Ghoshal et al. |
| 2004/0262745 A1 | 12/2004 | Cordes et al. |
| 2005/0150535 A1 | 7/2005 | Samavedam et al. |
| 2005/0150536 A1 | 7/2005 | Ngai et al. |
| 2005/0150537 A1 | 7/2005 | Ghoshal |
| 2005/0150539 A1 | 7/2005 | Ghoshal et al. |
| 2005/0160752 A1 | 7/2005 | Ghoshal et al. |
| 2005/0178423 A1 | 8/2005 | Ramanathan et al. |
| 2006/0076046 A1 | 4/2006 | Ghoshal et al. |
| 2006/0086096 A1 | 4/2006 | Ghoshal |
| 2006/0086118 A1 | 4/2006 | Venkatasubramanian et al. |
| 2006/0088271 A1 | 4/2006 | Ghoshal |
| 2006/0137359 A1 | 6/2006 | Ghoshal |
| 2006/0137360 A1 | 6/2006 | Ghoshal |
| 2006/0137361 A1 | 6/2006 | Ghoshal |

FOREIGN PATENT DOCUMENTS

| | | |
|---|---|---|
| DE | 195 37 121 A1 | 4/1997 |
| DE | 101 51 072 A1 | 4/2003 |
| EP | 0 687 020 | 12/1995 |
| EP | 0 805 501 | 11/1997 |
| GB | 2 037 072 B | 4/1983 |
| JP | 6-97512 | 4/1994 |
| WO | WO 79/00626 A1 | 9/1979 |
| WO | WO 80/01438 A1 | 7/1980 |
| WO | WO98/43740 | 10/1998 |
| WO | WO98/44562 | 10/1998 |
| WO | WO 00/49664 | 8/2000 |
| WO | WO 01/08800 | 2/2001 |
| WO | WO 02/45150 A1 | 6/2002 |
| WO | WO 2004/008042 A2 | 1/2004 |
| WO | WO 2005/074463 A2 | 8/2005 |

OTHER PUBLICATIONS

Development of Low-Bandgap Ge and $SI_{0.07}Ge_{0.03}$ Solar Cells for Monolithic and Mechanically-Stacked Cascade Applications; Rama Venkatasubramanian et al., pp. 73-78.

Fields, S., Proteomics In Genomeland, Science vol. 291 No. 5507 pp. 1221-1224, pp. 1-7.

Graded-Band-GAP AlGaAs Solar Cells For AlGaAs/Ge Cascade Cells, M.L. Timmons, et al., pp. 68-72.

Fitch, J. Patrick, Bahrand Sokhansanj, IEEE, Genomic Engineering: Moving Beyond DNA Sequence to Function, Proceedings of the IEEE, vol. 88, No. 12, Dec. 2000, pp. 1949-1971.

Hofmeister, Rudolf et al., New Photorefractive Mechanism in Centrosymmetric Crystals: A Strain-Coordinated Jahn-Teller Relaxation, Physical Review Letters, vol. 69, No. 9, Aug. 31, 1992, pp. 1459-1462.

Samuel K. Moore, Making Chips, IEEE Spectrum, Biotechnology, Mar. 2001, pp. 54-60.

Photoexcited Carrier Lifetimes and Spatial Transport in Surface-free GaAS Homostructures, L.M. Smith et al., J. Vac. Sci. Technol. B, vol. 8, No. 4 Jul./Aug. 1990, pp. 787-792.

Ideal Electronic Properties of a p-Ge/p-$Al_{o.85}Ga_{0.15}$As Interface, Rama Venkatasubramanian et al., Appl. Phys. Lett., vol. 59, No. 3, Jul. 15, 1991, pp. 318-320.

Selective Plasma Etching of Ge Substrates for Thin Freestanding GaAs-AlGaAs Heterostructures, Rama Venkatasubramanian et al., Appl. Phys. Lett., vol. 59, No. 17, Oct. 21, 1991, pp. 2153-2155.

Visible Light Emission From Quantized Planar Ge Structures, Rama Venkatasubramanian et al., Appl. Phys. Lett., vol. 59, No. 13, Sep. 23, 1991, pp. 1603-1605.

GaInAsP Lattice Matched to GaAs for Solar Cell Applications, P.R. Sharps, et al., Research Triangle Institute, P.O. Box 12194, RTP, NC 27709. pp. 315-317.

High-Temperature Performance and Radiation Resistance of High-Efficiency Ge and $Si_{0.07}Ge_{0.03}$ Solar Cells on Lightweight Ge Substrates, Rama Venkatasubramanian et al., pp. 85-98.

Physical Basis and Characteristics of Light Emission From Quantized Planar Ge Structures, Rama Venkatasubramanian, et al., pp. 15.4.1-15.4.4.

High Quality GaAs on Si Using $Si_{0.04}Ge_{0.96}$/Ge Buffer Layers, Rama Venkatasbramanian, et al., Journal of Crystal Growth 107 (1991) pp. 489-493.

The New Face of A.I., Michael Powell, Merger Maniac Europe's CD Underworld, The Supercheap Future of Flying, Mar. 2002, Hacking the Racetrack, Insife Nuke University, Wired, A New Kind of Cool, Rama Venkatasubramanian.

Optimization of the Heteroepitaxy of Ge on GaAs for Minority-Carrier Lifetime, Rama Venkatasubramanian, et al., Jouranl of Crystal Growth 112 (1991) pp. 7-13, Received Aug. 9, 1990; manuscript received in final form Dec. 14, 1990.

Intrinsic Recombination and Interface Characterization in "surface-free" GaAs Structures, D.J. Wolford et al., J. Vac. Sci. Technol. B. vol. 9, No. 4, Jul./Aug. 1991, pp. 2369-2376.

Advances in the Development of an AlGaAs/GaAs Cascade Solar Cell Using a Patterned Germanium Tunnel Interconnect, Rama Venkatasubramanian et al., pp. 345-354.

High-Quality Eutectic-Metal-Bonded AlGaAs-GaAs Thin Films on SI Substrates, Rama Venkatasubramanian et al., Appl. Phys. Lett., vol. 60, No. 7, Feb. 17, 1992, pp. 886-888.

Photoluminescence of Porous Silicon Buried Underneath Epitaxial GaP, J.C., Campbell, et al., Appl. Phys. Lett., vol. 60, No. 7, Feb. 17, 1992, pp. 889-891.

Interface-Free GaAs Structures—From Bulk to the Quantum Limit, D.J. Wolford, et al, Inst. Phys. Conf. Ser. No. 120: Chapter 9, pp. 401-406.

Properties and Use of Cycled Grown OMVPE GaAs: Zn, GaAS:Se, and GaAS:Si Layers for High-Conductance GaAS Tunnel Junctions, Rama Venkatasubramanian et al., National Renewable Energy Laboratory, Golden, CO 80401, pp. 893-899.

Thermal Characterization of $Bi_2$, $Te_3$/$Sb_2$ $Te_3$ Superlattices, M.N. Touzelbaev and P. Zhou, Department of Mechanical Engineering, Stanford University, Stanford, California 94305-3030, Rama Venkatasubramanian, Center for Semiconductor Research, Research Triangle Institute, Research Triangle Park, Durham, NC 27709-2195, K.E. Goodson Electronic mail goodson@vk.stanford.edu. Journal of Applied Physics, vol. 90, No. 2, Jul. 15, 2001, pp. 763-767.

Smaller, Faster, Efficient Thermoelectric Cooling, Rama Venkatasubramanian, vol. 30, No. 41, Oct. 17, 2001 ISSN: 0300-757X, pp. 1-2.

CVD Diamond for Components and Emitters, J. Davidson, Corresponding Author, e-mail address: jld@vuse.vanderbilt.edu (J. Davidson) et al., Vanderbilt University 2201 West End Avenue, Nashville, TN 37235, USA, Diamond and Related Materials 10 (2001) pp. 1736-1742.

Sneak Preview, Optical Device Transfers Data Fast, Rama Venkatasubramanian, design news Dec. 17, 2001. p. 14.

Lattice Thermal Conductivity Reduction and Phonon Localization-like Behavior in Superlattice Structures, Rama Venkatasubramanian, Research Triangle Institute, Research Triangle Park, North Carolina 27709, Physical Review B., vol. 61, No. 4, Jan. 15, 2000—II, pp. 3091-3097.

Phonon-Blocking Electron-Transmitting Structures, Rama Venkatasubramanian et al., Research Triangle Institute, Research Triangle Park, NC, USA, 18 International Conference on Thermoelectric (1999), pp. 100-103.

Magnetoresistance Technique for Determining Cross-Plane Mobility in Superlattice Devices, S.W. Johnson et al., National Renewable Energy Laboratory, Golden, CO, USA, Research Triangle Institute, Research Triangle Park, NC, USA, $18^{th}$ International Conference on Thermoelectrics (1999), pp. 675-686.

RTI Research Yields Major Advance in Thermoelectrics, Rama Venkatasubramanian et al., pp. 8-9.

RTI International, "New Thermoelectric Materials Can Keep Chips Cool Advances in Fiber Optics and in Biotechnology also are Likely" Oct. 9, 2001.

RTI International Annual Report 2001, Turning Knowledge into Practice, pp. 4-37.

Cooling Film Tempers Tiny Hot Spots, Rama Venkatasubramanian et al, Science News, No. 3, 2001, v160, i18, p. 280.

Phonon Blocking Electron Transmitting Superlattice Structures as Advanced Thin Film Thermoelectric Materials, Rama Venkatasubramanian, Research Triangle Institute, Research Triangle Park, NC, Chapter 4, Semiconductors and Semimetals, vol., pp. 175-201.

Improved Photoluminescence of GaAs in ZnSe/GaAs Heterojunctions grown by Organometallic Epitaxy, S.K. Ghandhi et al., Electrical Computer, and Systems Engineering Department, Rensselaer Polytechnic Institute, Troy, New York 12180, Appl. Phys. Lett. vol. 53 No. 14, Oct. 3, 1988, pp. 1308-1310.

Epitaxy of Germanium using Germane in the Presence of Tetramethylgermanium, Rama Venkatasubramanian et al., Research Triangle Institute, P.O. Box 12194, Research Triangle Park, NC, 27709, J. Appl. Phys. vol.. 66, No. 11, Dec. 1, 1989, pp. 5662-5664.

Radiative Recombination in Surface free $n^+In^-In^+$ GaAs Homostructures, L.M. Smith and D.J. Wolford et al., Appl. Phys. Lett., vol. 57, No. 15, Oct. 8, 1990, pp. 1572-1574.

Measurement of Al/GaAs/AlGaAs Interface Recombination Velocities Using Time-Resolved Photoluminescence, M.L. Timmons, et al., Appl. Phys. Lett. vol. 56, No. 19, May 7, 1990, pp. 1850-1852.

Thin-Film Thermoelectric Devices with High Room-Temperature Figures of Merit, Rama Venkatasubramanian et al., Research Triangle Institute, Research Triangle Park, North Carolina 27709, USA, 2001 Macmillian Magazines Lt., Nature, vol. 413, Oct. 11, 2001, www.nature.com pp. 597-602.

In-situ Monitoring of the Growth of $Bi_2$ $Te_3$ and $Sb_2$ $Te_3$ Superlattice Using Spectroscopic Ellipsometry Hao Cui et al. Journal of Electronic Materials, vol. 30, No. 11 2001, Special Issue Paper, pp. 1376-1381.

Incorporation Processes in MBE Growth of ZnSe, Rama Venkatasubramanian et al., Jouranl of Crystal Growth 95 (1989) pp. 533-537.

An Inverted-Growth Approach To Development of an IR-Transparent, High-Efficiency AiGaAs/GaAs Cascade Solar Cell, Rama Venkatasubramanian, M.L. Timmons, T.S. Colpitts, J.S. Hills, and J.A. Hutchby, Research Triangle Institute, Research Triangle Park, NC 27709, 1991 IEEE pp. 93-98.

15.8%-Efficient (1-SUN, AM 1.5G) GaAs Solar Cell on Optical-Grade Polycrystalline Ge Substrate, Rama Venkatasubramanian et al., pp. 691-695.

Development of 20% Efficient GainAsP Solar Cells, P.R. Sharps, et. al., 1993 IEEE pp. 633-638.

Development of High-Efficiency $Al_{0.2}Ga_{0.8}As$ Solar Cells and Interconnect Schemes for $Al_{0.2}Ga_{0.3}As$/Si Mechanically-Stacked Cascade Cells, Rama Venkatasubramanian, et al., 1993 IEEE pp. 752-756.

Photorefledtance Charaterization of InP and GaAs Solar Cells, R.G. Rodrigues et al., 1993 IEEE pp. 681-685.

Close-Packed Cell Arrays for Dish Concentrators, J.B. Lasich et al., Solar Research Corporation Pty. Ltd., 6 Luton Lane, Hawthorn, Victoria 3122, Australia and M. Timmons et al., Research Triangle Institute, RTP, USA, 1994 IEEE pp. 1938-1941.

GaAs and $Al_{0.2}Ga_{0.8}As$ Solar Cells With An Indirect-Bandgap $Al_{0.8}Ga_{0.2}As$ Emitter—Heterojunction Cellls, Rama Venkatasubramanian et al., Research Triangle Institute, RTP, NC 27709, H. Field and K. Emery, National Renewable Energy Laboratory (NREL), Golden, CO 80401, First WCPEC: Dec. 5-9, 1994; Hawaii, pp. 1839-1842.

The Growth and Radiation Response of $N^+p$ Deep Homojunction InP Solar Cells, M.J. Panunto et al., M.L. Timmons, et al., First WCPEC; Dec. 5-9, 1994; Hawaii, pp. 2192-2195.

Material and Device Characterization Toward High-Efficiency GaAs Solar Cells on Optical-Grade Polycrystalline Ge Substrates, Rama Venkatasubramanian, et al., R. Ahrenkiel, et. al, First WCPEC; Dec. 5-0, 1994; Hawaii, 1994 IEEE pp. 1692-1696.

Silicon and GAAS/GE Concentrator Power Plants: A Comparison of Cost of Energy Produced, R.A. Whisnant et al., First WCPEC; Dec. 5-9, 1994; Hawaii, 1994 IEEE pp. 1103-1106.

Compensation Mechanisms in N[+]-GaAs Doped With Silicon, Rama Venkatasubramanian, et al., Electrical Computer, and Systems Engineering Department, Rensselaer Polytechnic Institute, Troy, New York 12180, USA, Journal of Crystal Growth 94 (1989). pp. 34-40.

High-Efficiency Tandem Solar Cells on Single-and Poly-Crystalline Substrates, J.A. Hutchby et al., Center for Semiconductor Research, Research Triangle Institute, Research Triangle Park, NC 27709, USA, Solar-Energy Materials and Solar Cells 35 (1994) pp. 9-24.

Optoelectronic Properties of Eutectic-Metal-Bonded (EMB) GaAs-AlGaAs Structures on Si Substrates, Rama Venkatasubramanian, et al., Solid-State Electronics vol. 37, No. 11, pp. 1809-1815, 1994.

Heteroepitaxy and Characterization of Ge-rich SiGe Alloys on GaAs, Rama Venkatasubramanian et al., J. Appl. Phys. vol. 69. No. 12, Jun. 15, 1991, pp. 8164-8167.

18.2% (AM1.5) Efficient GaAs Solar Cell on Optical-Grade Polycrystalline Ge Substrate, Rama Venkatasubramanian et al., 25th PVSC; May 13-17, 1996; Washington, D.C. 1996 IEEE pp. 31-36.

Experimental Evidence of High Power Factors and Low Thermal Conductivity in $Bi_2Te_3/Sb_2Te_3$ Superlattice Thin-Films, Rama Venkatasubramanian et al., Research Triangle Institute, Research Triangle Park, NC 27709, USA, 15th International Conference on Thermoelectrics (1996), 1996 IEEE pp. 454-458.

Thermal Conductivity of Si-Ge Superlattices, S.-M. Lee and David G. Cahill[a], Rama Venkatasubramanian, Appl. Phys. Lett. vol. 70, No. 22, Jun. 2, 1997, pp. 2957-2959.

20% (AM1.5) Efficiency GaAs Solar Cells on Sub-mm Grain-Size Poly-Ge and Its Transition to Low-Cost Substrates, Rama Venkatasubramanian et al., 26th PVSC: Sep. 30-Oct. 3, 1997; Anaheim, CA 1997 IEEE, pp. 811-814.

Electronic and Mechanical Properties of Ge Films Grown on Glass Substrates, R.K. Ahrenkiel et al., 26th PVSC; Sep. 30-Oct. 3, 1997; Anaheim, CA, pp. 527-529.

MOCVD of $Bi_2Te_3$ and Their Superlattice Structures for Thin-Film Thermoelectric Applications, Rama Venkatasubramanian et al., Journal of Crystal Growth 170 (1997), pp. 817-821.

A Silent Cool: Thermoelectrics May Offer New Ways to Refrigerate and Generate Power, Corinna Wu, Science News, Sep. 6, 1997 v152 n10 p. 152(2), pp. 1-3.

ONR Contributes to Thermoelectric Research (Office of Naval Research) (Brief Article), Ozone Depletion Network Online Today, Contact ONR, website http://www.onr.navy.mil., Nov. 2001.

In-Plane Thermoelectric Properties of Freestanding Si/Ge Superlattice Structures, Rama Venkatasubramanian et al., 17th International Conference on Thermoelectrics (1998), pp. 191-197.

Potential of Si-based Superlattice Thermoelectric Materials for Integration with Si Microelectronics, Rama Venkatasubramanian et al., 1998 IEEE. p. 869.

Low-temperature Organometallic Epitaxy and Its Application to Superlattice Structures in Thermoelectrics, Rama Venkatasubramanian, [a], et al., Sandra Liu and Nadia El-Masry, Michael Lamvik, Applied Physics Letters, vol. 75, No. 8, Aug. 23, 1999, pp. 1104-1106.

Optical Constants of $Bi_2Te_3$ and $Sb_2Te_3$ Measured Using Spectroscopic Ellipsometry, HAO CUI, [1]I.B. BHAT[1,3] and Rama Venkatasubramanian[2], 1-Electrical, Computer and Systems Engineering Department, Rensselaer Polytechnic Institute, Troy, NY 12180-3590, USA. 2.-Research Triangle Institute, Research Triangle Park, NC 27709, USA, 3-e-mail:bhati@rpi.edu., Journal of Electronics Materials, vol. 28, No. 10, 1999, pp. 1111-1114.

Thin-Film Technology, Research Triangle Institute, Investment Opportunities, in Thermoelectronics, Apr. 6, 2001, website http://www.rti.org/units/es.cfm, pp. 1-2.

Nature Publishing Group, Materials Update, Cool Future for Semiconductors, Oct. 11, 2001. pp. 1-3.

Cool New Film, Science Update, Oct. 11, 2001, http://www.nature.com/nsu/011011/011011-12.html, pp. 1-2.

Semiconductors are Cool, News and Views, Cronin B. Vining, 2001 Macmillan Magazines Ltd., Nature, vol. 413, Oct. 11, 2001, www.nature.com, pp. 577-578.

Thermoelectric Boost, Richard Babyak, Appliance Manufacturer, Design and Engineering Solutions for the Global Appliance Industry, http://www.ammagazine.com/CDA/ArticleInformation/features/BNP Features Item/0.260... Jul. 18, 2002, pp. 1-2.

Thermoelectrics from Hot to Cool, New Technology Offers Efficient way to Heat or Cool ICS in Operation, Jeff Dorsch, Semiconductor Magazine, http://www.semi.org/web/wmagazine.nsf/4f55b97743c2d02e882565bf006c2459/27e74866ea..., Jun. 20, 2002, pp. 1-3.

Nanostructured Superlattice Thin-Film Thermoelectric Devices; Nanotechnology and the Environment Applications and Implications; American Chemical Society (2005) (ACS Symposium Series 890) Chapter 47, pp. 347-352.

Grove issues power warning at IEDM lunch; David Lammers (Dec. 10, 2002) http://www.eetimes.com/showArticle.jhtml?articleID=10806530,; EETIMES online.

Superlattice Thin-film Thermoelectric Materials and Devices; Rama Venkatasubramanian et al.; Mat. Res. Soc. Symp. Proc. vol. 793 (2004 Materials Research Society) pp. 51-58.

Lattice thermal conductivity reduction and phonon localizationlike behavior in superlattice structures; Rama Venkatasubramanian; Physical Review B, vol. 61, No. 4 (Jan. 15, 2000) pp. 3091-3097.

1.3 Peltier Cooling and the Thermoelectric Figure of Merit; G.S. Nolas et al.; Thermo-electrics Basic Principles and New Materials Developments; Materials Science; pp. 8-13.

IR-Mediated PCR <http://faculty.virginia.edu/landers/Irframe.htm>.

Supplementary Partial European Search Report, Application No. EP 02 72 5575 Apr. 4, 2006.

International Search Report and Written Opinion for PCT/US2006/014377; date of mailing Jan. 12, 2007.

Reddy et al. "Measurement and Analysis of Power Conversion Efficiency in Thin-Film and Segmented Thermoelectric Devices" *Thermoelectrics, ICT 2005, 24[th i International Conference]* : 72-75 (2005).

Venkatasubramanian et al. "Thin-film thermoelectric devices with high room-temperature figures of merit" *Nature* 413:597-602 (2001).

Venkatasubramanian et al. "Superlattice Thin-film Thermoelectric Materials and Devices" *Mat. Res. Soc. Symp. Proc.* 793:S2.3.1-S2.3.9 (2004).

International Search Report and Written Opinion (11 pages) corresponding to International Application No. PCT/USO4/41431; Mailing Date: Aug. 8, 2008.

Shakouri et al. "On-Chip Solid-State Cooling for Integrated Circuits Using Thin-Film Microrefrigerators" XP-002428271, IEEE Transactions on Components and Packaging Technologies, 28(1):65-69 (2005).

Zhang et al. "High Speed Localized Cooling Using SiGe Superlattice Microrefrigerators" 19th IEEE Semi-Therm Symposium pp. 61-65 (2003).

* cited by examiner

FIG. 5

TABLE 2

| | | $T_{heat-sink}$ = 300K $T_{heat-source}$ = 845K | | $T_{heat-sink}$ = 323K $T_{heat-source}$ = 893K | |
|---|---|---|---|---|---|
| | ZTave | EFFICIENCY (%) | | EFFICIENCY (%) | |
| UPPER PROJECTION | | | | | |
| Stage 1 (Bi2Te3-based SL) | 2.5 | 11.4%; | OT = 150C | 10.8%; | OT = 150C |
| Stage 2 (with PbTe/PbSe SL) | 1.5 | 6.9%; | OT = 175C | 7.4%; | OT = 200C |
| Stage 3 (with Si/Ge SL) | 1.5 | 5.9%; | OT = 200C | 5.5%; | OT = 200C |
| Total Efficiency and Power Density for 3-stage Cascade Module | | 24.2%; | | 23.7%; | |
| MID-RANGE PROJECTION | ZTave | EFFICIENCY (%) | | EFFICIENCY (%) | |
| Stage 1 (Bi2Te3-based SL) | 2.25 | 10.8%; | OT = 150C | 10.2%; | OT = 150C |
| Stage 2 (with PbTe/PbSe SL) | 1 | 5.3%; | OT = 175C | 5.7%; | OT = 200C |
| Stage 3 (with Si/Ge SL) | 1 | 4.5%; | OT = 200C | 4.2%; | OT = 200C |
| Total Efficiency and Power Density for 3-stage Cascade Module | | 20.6%; | | 20.1%; | |
| LOWER PROJECTION | ZTave | EFFICIENCY (%) | | EFFICIENCY (%) | |
| Stage 1 (Bi2Te3-based SL) | 2 | 10.2%; | OT = 150C | 9.6%; | OT = 150C |
| Stage 2 (use only thin-substrate bulk) | 0.75 | 4.3%; | OT = 175C | 4.7%; | OT = 200C |
| Stage 3 (use only thin-substrate bulk) | 0.75 | 3.7%; | OT = 200C | 3.4%; | OT = 200C |
| Total Efficiency and Power Density for 3-stage Cascade Module | | 18.2%; | | 17.7%; | |

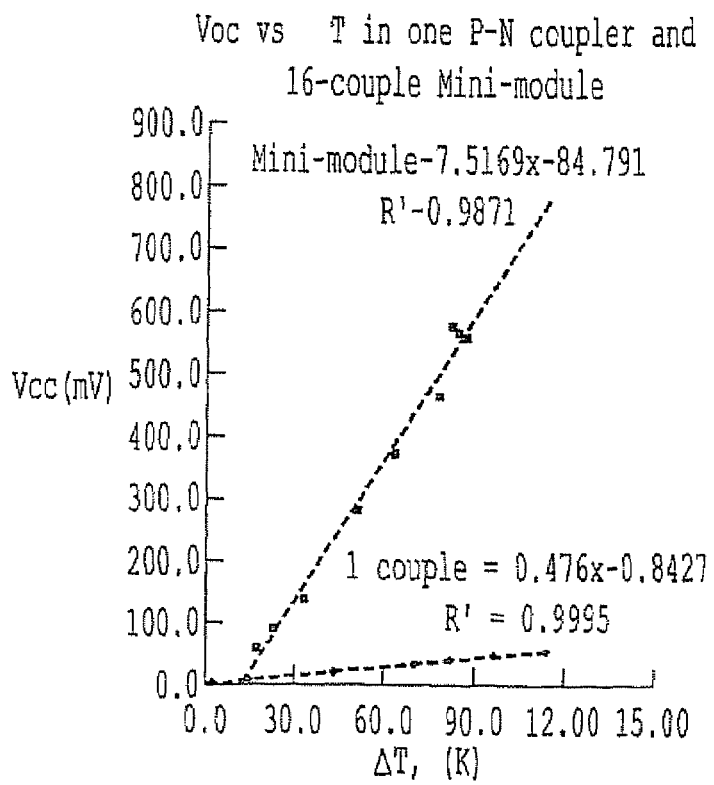
FIG. 6B(1)
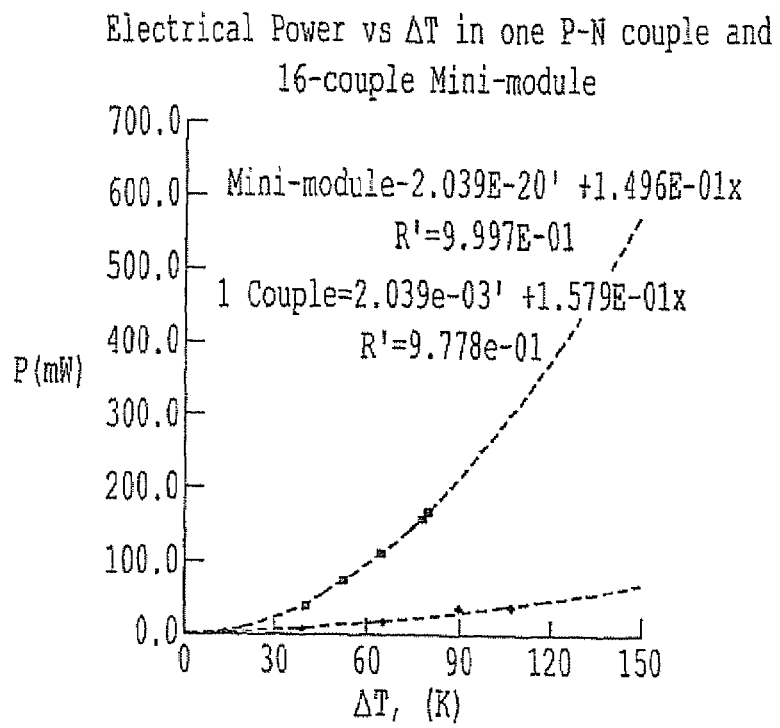
FIG. 6B(2)

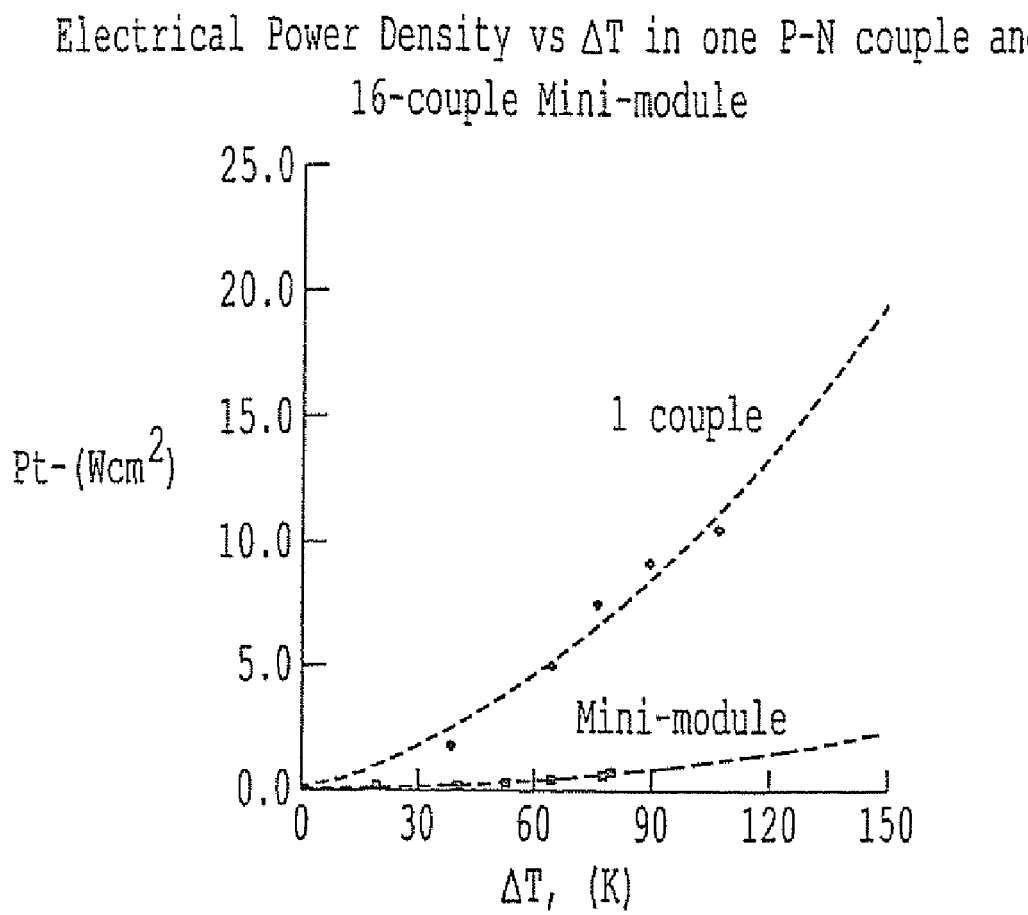
FIG. 6B(3)

Table 4

| Structure and Comments on Measurement | Configuration | Best Observed ZT | Typical ZT | Potential ZT |
|---|---|---|---|---|
| P-type Element with two contacts | | >3.5 | 2.5 to 3.0 | 3.5 to 4.0 |
| N-type Element with two contacts | | 2.0 | 1.0 to 1.5 | 2.0 to 2.5 |
| Invented P-N Couple one interconnect (adiabatic conditions tough but exact thermal-electrical-matching between two legs not required to maximize ZT observed) | | 2.0 | 1.2 to 1.8 | 2.0 to 2.5 |
| Mini-module: Flipped, Inverted P-N Couple with one interconnect and two leads on bottom header (adiabatic conditions difficult plus exact thermal-electrical matching between two legs needed to maximize ZT observed by Harman method) | | ~1.6 (limited by lead resistances on the bottom header) | ~1.8 (limited by lead resistances on the bottom header) | >2.0 |
| Mini-module: Flipped, Inverted P-N Couple with one interconnect and two leads on bottom header ( power mode where ZT is exacted from electrical power and heat flow through SL elements; no need for adiabaticity and thermal matching of legs less stringent (as one leg does not pump on other as in cooling mode when mismatched) | Bottom Header | ~1.6 (limited by lead resistances on the bottom header) | ~1.6 (limited by lead resistances on the bottom header) | >2.0 |

*FIG. 6C*

Table 5

| STEP | BONDING PROCESS | Heat Spreader | Solder Material | Interconnect Metallization and Resistivity at Mean Operating Temperature | Solder Diffusion Barriers |
|---|---|---|---|---|---|
| 1 | In Stage 3 of the Cascade: 1050K | AlN or Si | AgCu (72/28) Eutectic | Silver (p-4.5µ Ohm-cm) | W (sputtered) |
| 2 | In Stage 2 of the Cascade: 800K | AlN | AgAuGe (45/38/17) Eutectic | Silver (p-33µ Ohm-cm) | Mo (E-beam) |
| 3 | In Stage 1 of the Cascade: 505K* | SiC | Sn | Copper (p-2.3µ Ohm-cm) | Ni (E-beam or plated) |
| 4 | Of heat Source to Stage 3 at 975K | N/A | AgCuP (15/80/5) | N/A | N/A |
| 5 | Of Stage 2 to Stage 3 (with Heat Source) at 738K | N/A | AuIn (75/25) | N/A | N/A |
| 6 | Of Stage 1 to Stage 2 (with Stage 3 and Heat source) at 490K | N/A | SnAu (90/10) | N/A | N/A |
| 7 | Of Heat sink to bottom of Stage 1 at 395K | N/A | InSn (52/48) | N/A | N/A |

Figure 22

Table 1

| Material | Lattice Constant (Å) at 300K | Velocity of Sound (cm/sec) at 300K | Eg (eV) at 500K | Eg (eV) at 600K | Eg (eV) at 650K |
|---|---|---|---|---|---|
| PbTe | 6.462 | $1.26 \times 10^5$ | 0.4 | 0.445 | 0.468 |
| PbSe | 6.117 | $1.42 \times 10^5$ | 0.38 | 0.431 | 0.457 |

Figure 23

Table 3

| Type | ZT as made $t_{anneal}$ ~ 0 hrs. | ZT after $t_{anneal}$ ~ 15 hrs. | ZT after $t_{anneal}$ ~ 30 hrs. | ZT after $t_{anneal}$ ~ 45 hrs. | ZT after $t_{anneal}$ ~ 60 hrs. |
|---|---|---|---|---|---|
| P | 1.7 ± 0.25 | 2.0 ± 0.25 | 2.25 ± 0.25 | 2.25 ± 0.25 | 1.95 ± 0.25 |
| N | 0.59 ± 0.1 | 0.68 ± 0.1 | 0.84 ± 0.15 | 0.71 ± 0.1 | 0.76 ± 0.15 |

THERMOELECTRIC GENERATORS FOR SOLAR CONVERSION AND RELATED SYSTEMS AND METHODS

RELATED APPLICATIONS

The present application claims the benefit of priority as a continuation-in-part of International Application No. PCT/US2004/041431 (designating the United States) filed on Dec. 13, 2004, which claims the benefit of priority from U.S. Provisional Application No. 60/528,479 filed Dec. 11, 2003. The present application also claims the benefit of priority from U.S. Provisional Application No. 60/672,330 filed Apr. 18, 2005. The disclosures of each of the above referenced International PCT and U.S. Provisional Applications are hereby incorporated herein in their entirety by reference.

FIELD OF THE INVENTION

The present invention relates to the field of electronics, and more particularly, to electronics for solar energy conversion and related methods, devices, and systems.

BACKGROUND

A solar cell (also referred to as a photovoltaic cell) may be provided using a semiconductor material such as Si, GaAs, AlGaAs, GaInP, and/or AlInP. When light (such as solar radiation) passes through the semiconductor material of a solar cell, an electrical current and/or voltage may be generated, and the electrical current and/or voltage may be used to operate an electrical device and/or to charge a battery. Accordingly, electrical generation requires that the semiconductor material of the solar cell be directly exposed to the sun or another source of light, and electrical power generation is not available at night or in the dark. Moreover, an area of capture of solar energy may require an equal area of exposed electronic grade semiconductor material, and the electronic grade semiconductor material may be relatively expensive to manufacture.

Accordingly, there continues to exist a need in the art for improved structures to provide conversion of solar energy into electricity.

SUMMARY

According to some embodiments of the present invention, a thermoelectric generator may include first and second thermally conductive plates and a plurality of pairs of P-type and N-type thermoelectric elements. The first thermally conductive plate may be configured to generate heat responsive to solar radiation, and the first and second thermally conductive plates may be spaced apart. Moreover, the P-type and N-type thermoelectric elements of each pair may be electrically coupled in series, and the P-type and N-type thermoelectric elements of each pair may be thermally coupled in parallel between the first and second thermally conductive plates.

The pairs of P-type and N-type thermoelectric elements may be spaced apart, and a packing fraction of the P-type and N-type thermoelectric elements relative to the first thermally conductive plates may be less than about 50 percent. More particularly, the packing fraction of the P-type and N-type thermoelectric elements relative to the first thermally conductive plate may less than about 20 percent, less than about 10 percent, even less than about 1 percent, and even less than about 0.5 percent. By providing a relatively low packing fraction, a heat flux through individual thermoelectric elements may be increased thereby increasing efficiency and/or a quantity of electronic grade semiconductor material may be reduced thereby reducing cost.

The first thermally conductive plate may include a first surface in thermal contact with the P-type and N-type thermoelectric elements and a second surface opposite the P-type and N-type thermoelectric elements, and the second surface is configured to generate heat responsive to solar radiation incident thereon. For example, the second surface may be optically dark to enhance absorption of solar radiation. Moreover, the first and second surfaces may be substantially planar.

The second thermally conductive plate may provide a thermal coupling to a temperature stable thermal mass such as subterranean soil, water, and/or rock, or the second thermally conductive plate may be configured to radiate heat into a vacuum of space. In addition, the P-type and N-type thermoelectric elements may include P-type and N-type $Bi_2Te_3$ thermoelectric elements, and more particularly, superlattices of $Bi_2Te_3$ and $Sb_2Te_3$.

In addition, a cover may be provided adjacent the first thermally conductive plate so that the first thermally conductive plate is between the cover and the pairs of P-type and N-type thermoelectric elements. More particularly, the cover may be spaced apart from the first thermally conductive plate, and the cover may be transparent with respect to solar radiation incident thereon. Moreover, a space between the cover and the first thermally conductive plate may be sealed from an environment adjacent a surface of the transparent cover opposite the first thermally conductive plate, and a vacuum may be maintained in the space between the cover and the first thermally conductive plate.

The plurality of pairs of P-type and N-type thermoelectric elements may be configured to generate an electrical signal responsive to a difference in temperature between the first and second thermally conductive plates, and an electrical load may be coupled to the plurality of pairs of P-type and N-type thermoelectric elements. The electrical load, for example, may include a battery charging circuit, a battery, an electronic circuit, a regulator (such as a voltage regulator), and/or a converter (such as a DC-to-DC power converter and/or a DC-to-AC power converter).

The thermoelectric generator may also be configured to provide nighttime power generation. For example, the second thermally conductive plate may provide thermal coupling to a temperature stable thermal mass (such as subterranean rock, soil, and/or water). During daylight operation, the first thermally conductive plate may be configured generate heat responsive to solar radiation so that heat flows from the first thermally conductive plate to the second thermally conductive plate. During nighttime operation, the first thermally conductive plate may be configured to radiate heat so that heat flows from the second thermally conductive plate to the first thermally conductive plate.

According to some more embodiments of the present invention, a thermoelectric generator may include first and second thermally conductive plates and a plurality of pairs of P-type and N-type thermoelectric elements. The first thermally conductive plate may be configured to radiate heat, and the second thermally conductive plate thermally may be thermally coupled to a temperature stable thermal mass. Moreover, the P-type and N-type thermoelectric elements of each pair may be electrically coupled in series, and thermally coupled in parallel between the first and second thermally conductive plates.

The pairs of P-type and N-type thermoelectric elements may be spaced apart, and a packing fraction of the P-type and N-type thermoelectric elements relative to the first thermally conductive plate may be less than about 50%. Moreover, the temperature stable thermal mass may include at least one of subterranean soil, water, and/or rock.

In addition, a cover may be provided adjacent the first thermally conductive plate so that the first thermally conductive plate is between the cover and the pairs of P-type and N-type thermoelectric elements. Moreover, the cover may be spaced apart from the first thermally conductive plate, and the cover may be transparent with respect to heat radiated from the first thermally conductive plate. In addition, a space between the cover and the first thermally conductive plate may be sealed from an environment adjacent a surface of the transparent cover opposite the first thermally conductive plate. The first thermally conductive plate may be configured to radiate heat through the space between the first thermally conductive plate and the cover and through the cover, and a vacuum may be maintained in the space between the cover and the first thermally conductive plate.

The plurality of pairs of P-type and N-type thermoelectric elements may be configured to generate an electrical signal responsive to a difference in temperature between the first and second thermally conductive plates. In addition, an electrical load may be coupled to the plurality of pairs of P-type and N-type thermoelectric elements, and the electrical load may include a battery charging circuit, a battery, an electronic circuit, a regulator (such as a voltage regulator), and/or a converter (such as a DC-to-DC power converter and/or a DC-to-AC power converter).

In addition, the thermoelectric generator may be configured to provide daytime and nighttime operation. During nighttime operation, the first thermally conductive plate may be configured to radiate heat so that heat flows from the second thermally conductive plate to the first thermally conductive plate. During daytime operation, the first thermally conductive plate may be configured generate heat responsive to solar radiation so that heat flows from the first thermally conductive plate to the second thermally conductive plate.

According to still more embodiments of the present invention, a thermoelectric generator may include first and second thermally conductive plates, and a plurality of pairs of P-type and N-type thermoelectric elements. The first and second thermally conductive plates may be spaced apart, and the second thermally conductive plate may be configured to generate a temperature difference between the first and second thermally conductive plates by radiating heat. Moreover, the P-type and N-type thermoelectric elements of each pair may be electrically coupled in series, and the P-type and N-type thermoelectric elements of each pair may be thermally coupled in parallel between the first and second thermally conductive plates.

The second thermally conductive plate may be configured to radiate heat into the vacuum of space, and/or the first thermally conductive plate may be configured to generate heat responsive to solar radiation incident thereon. Moreover, the pairs of P-type and N-type thermoelectric elements are spaced apart, and a packing fraction of the P-type and N-type thermoelectric elements relative to the first thermally conductive plate may be less than about 50%.

The plurality of pairs of P-type and N-type thermoelectric elements may be configured to generate an electrical signal responsive to a difference in temperature between the first and second thermally conductive plates. In addition, an electrical load may be coupled to the plurality of pairs of P-type and N-type thermoelectric elements, and the electrical load may include a battery charging circuit, a battery, an electronic circuit, a regulator (such as a voltage regulator), and/or a converter (such as a DC-to-DC power converter and/or a DC-to-AC power converter).

BRIEF DESCRIPTION OF THE DRAWINGS

FIG. 5 is a table of estimated design efficiencies for a three-stage thermoelectric device according to embodiments of the present invention.

FIG. 6B (1)-(3) depict tests on p-n couple devices according to embodiments of the present invention for-open-circuit voltage (Voc), power (P), and power density (Pd in $W/cm^2$.

FIG. 6C is a table illustrating an inverted processing approach according to embodiments of the present invention.

FIG. 22 is a table illustrating bonding processes according to embodiments of the present invention.

FIG. 23 is a table illustrating properties of PbTe/PbSe superlattice systems according to embodiments of the present invention.

FIG. 24 is a table illustrating Figures Of Merit for P-type and N-type thermoelectric elements according to embodiments of the present invention.

DETAILED DESCRIPTION

Figure 1A:
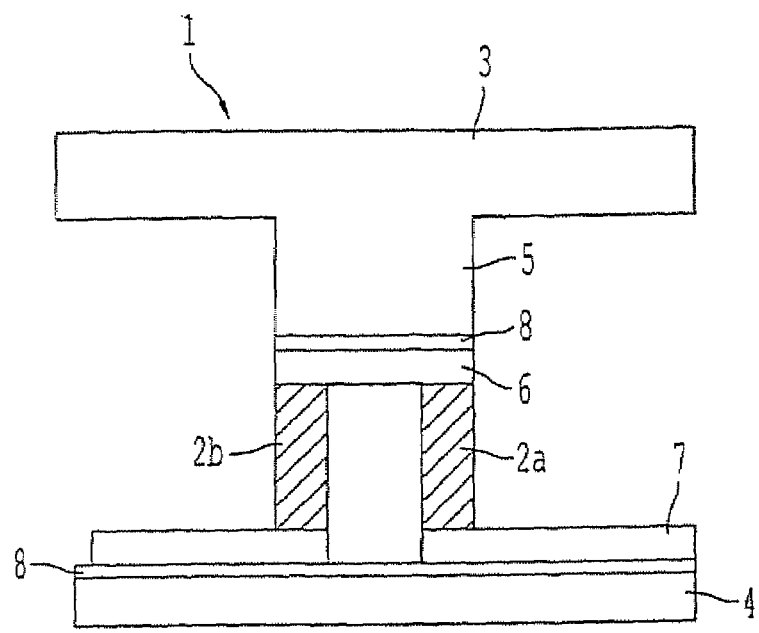
FIG. 1A is a schematic of a thermoelectric device according to embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting-of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Examples of embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

FIG. 1A depicts a schematic of a thermoelectric device according to embodiments of the present invention. As shown in FIG. 1A, a thermoelectric device 1 according to embodiment of the present invention includes a thermoelectric pair of n and p-type thermoelements 2a and 2b, respectively. The thermoelectric pair is connected thermally in parallel for heat conduction and electrically in series for electrical conduction. The thermoelectric pair of n and p-type thermoelements 2a and 2b are electrically adjoined together on the side coupled to an upper side header 3 by electrical connection 6, and are electrically connected separately on the side coupled to a lower side header 4 by electrical connection 7. As shown illustratively in FIG. 1A, the thermoelectric pair of n and p-type thermoelements 2a and 2b can be coupled to the upper side header 3 by a heat pipe 5 made of high thermal conductivity materials such as Si, SiC, AlN, etc. In this example, heat flowing in the thermoelectric device 1 is channeled in the heat pipe 5 into the thermoelectric pair of n and p-type thermoelements 2a and 2b.

In one embodiment of the present invention, due to the different thermoelectric properties of the n and p-type materials of the thermoelements 2a and 2b, electrons and holes in these materials diffuse at different rates across the respective n and p-type thermoelements, thereby creating a voltage difference across the pair of n and p-type thermoelements. In this embodiment, a cooling device (not shown) is coupled to the lower side header 4 to permit dissipation of heat. Otherwise, the upper side header 3, the pair of n and p-type thermoelements 2a and 2b, and the lower side header 4 would all come to nearly equivalent temperatures. As a consequence, the electrons and holes in the n and p-type thermoelements 2a and 2b would stop diffusing to the lower-side header.

In another embodiment of the present invention, electron and hole current can be driven through the n and p-type thermoelements 2a and 2b by an applied voltage to thereby cool the upper side header 3. Owing to electrical barriers existing between electrical connection 6 and the pair of n and p-type thermoelements 2a and 2b, the electron and hole current will preferentially transport those electrons and holes having a higher thermal energy, thereby cooling the upper side header 3. A heat dissipation device (not shown) coupled to the lower side header 4 permits dissipation of heat from the device, else the lower side header 4 would come to a temperature such that heat, via diffusion of phonons, would flow back to the upper-side header 3 at a rate equal to the heat being carried from the upper-side header 3 by the electron and hole current, thereby eliminating the cooling.

The optional heat pipe 5 represents a mechanism to increase the thermal impedance (through the gaps) between the upper side header 3 and the lower side header 4 to a value significantly larger (by a factor of 100 or more) than the thermal impedance across the thermoelectric pair 2a and 2b. As shown in FIG. 1A, the heat pipe 5 is elongated in a direction transverse to the thermoelectric device 1 (i.e., normal to the upper side header 3). The heat pipe 5 has a cross-sectional area smaller than that of an area of the upper side header 3. The heat pipe 5 according to embodiments of the present invention provides an offset, spacing apart the upper side header 3 from the lower side header 4. The offset permits, for example, thin-film thermoelements to be used without thermal conduction from the upper side header 3 to the lower side header 4 shunting across the gap between therebetween, thereby forcing heat flux to flow through the thermoelements 2a and 2b.

The offset in one embodiment of the present invention is at least 25 µm and more preferably in the range of 250 to 500 µm. As such, the offset produces a thermal impedance across a gap, where thermoelectric elements do not exist, between the upper side header 3 and the lower side header 4 whose value is at much larger than the thermal impedance across the pair of thermoelements 2a and 2b. For example, a thermal impedance across an air gap is greater than the thermal impedances for the thermoelements 2a and 2b, typically by a factor of 500 to 1000, for similar areas of air gap and thermoelectric materials. Thus, the offset allows this ratio to increase, using the high thermal conductivity of the offset relative to the air-gap. The thickness of the offset can be reduced as the pressure level in the gap is reduced, i.e., with a high vacuum level, the thermal conductivity of the gap is reduced and so we needless of the offset thickness. For many applications, the offset will be at least 10 µm, and for other applications in a range of about 100 µm (micrometer) to about 500 µm (micrometer).

Regardless of the heat pipe, the thermoelectric devices according to embodiments of the present invention conduct a high active heat flux, while maintaining a much lower flux through the surfaces 1 and 4, through the pair of thermoelements which may permit embodiments of the present invention to realize ultra-high specific power in the pair of n and p-type thermoelements 2a and 2b. Thus, embodiment of the present invention may operate with a high active flux through each of the thermoelements while having a low input/output flux across the entirety of the thermoelectric device. As described herein, this aspect according to embodiments of the present invention is referred as High Active Flux-Low Input-Output Flux (HAF-LIOF). This aspect is illustrated pictorially in FIG. 1B. In this aspect, the heat flux through the heat gatherer (e.g., an upper side header 3) and the heat spreader (e.g., an lower side header 4) is smaller than the heat flux through the n and p-type thermoelements 2a and 2b due to the reduced packing fraction of the thermoelements. A packing fraction of the thermoelements relative to the area of the heat spreader (s) permits the utilization of thinner thermoelements, thereby reducing the fabrication costs that would be involved should, for example, thicker sections of high ZT materials be required to maintain the requisite ΔT (temperature differential) across the thermoelectric device.

The packing fraction of thermoelements (i.e., the fraction of area occupied by the pair of n and p-type thermoelements 2a and 2b relative to a unit area of, for example, the upper-side header 3) in one embodiment of the present invention is less than 50%, less than 20%, and can be significantly lower, 0.5% to 1%, for example. A unit area for the heat spreader is defined as that fraction of the total area of the heat spreader which principally conducts heat into one of the associated pairs of n and p-type thermoelements attached to the heat spreader. For the single pair of n and p-type thermoelements shown in FIG. 1 B, the unit area would be the entire area of the upper side header 3. For instance, while the total heat flux into upper-side header 3 and out the lower-side header 4 can be on the order of 10-30 W/cm², the heat flux through each thermoelectric pair 2a and 2b can be as much as a factor of 100 times higher.

The preferred packing fraction is a function of the heat flux available at the heat-source, the required ΔT (temperature differential) needed across the thermoelement to achieve the maximum efficiency, and the heat-flux that can be dissipated at the heat-sink. For example, if the required heat-flux through the device element is 2500 W/cm² to generate a requisite ΔT (temperature differential), and the heat-flux that can be efficiently dissipated at the heat-sink is 25 W/cm², then a packing fraction of 1% will be used (i.e., 25/2500×100%). However, if the heat-flux that can efficiently be dissipated at the sink is only 2.5 W/cm², then a packing fraction needed would be 0.1% for the same heat-flux of 2500 W/cm² through each thermoelectric pair. A smaller packing fraction, however, can result in increased parasitic thermal transfer losses through any medium (such as air, Nitrogen, Helium) between the hot and cold-sides of the thermoelectric module.

Therefore, in thermoelectric devices according to embodiments of the present invention, besides using a heat pipe, other thermal impedance increasing devices can be employed. For example, a partial vacuum (i.e., about 1 Torr) as a low thermal impedance medium can be used in a module (e.g., the module 10 encapsulating the thermoelectric devices shown in FIG. 6A) containing the thermoelectric devices. Alternatively, the module 10 can be filled with a low conductivity gas such as, for example, Ar.

The headers and heat pipes according to embodiments of the present invention have thermally conducting properties. Examples of suitable materials for the headers and heat pipes include, for example, AlN, SiC, and diamond. These materials have relatively high thermal conductivities (e.g., 5 to 20

W/cm-K) and offer the advantage of being electrically insulating. Alternatively, metallic or other semiconductor materials can be used for the headers and heat pipes according to embodiments of the present invention provided a suitable electrical insulating layer 8 is added to the surface of those materials. The thermal conductance through the electrical insulating layer preferably presents no substantial impediment to vertical heat flow through the pair of n and p-type thermoelements 2a and 2b.

For example, the headers according to embodiments of the present invention can be made from a Si substrate of a thermal conductivity of about 1.2 to about 1.6 W/cm-K having a thin (i.e., about 10 nm to 1000 nm) $SiO_2$ or $Si_xN_y$ layer of a thermal conductivity of about 0.015 W/cm-K deposited thereon. For example, the headers according to embodiments of the present invention can also be made from a Cu substrate of a thermal conductivity of about 4 W/cm-K having a thin (i e., about 100 to 1000 nm) $SiO_2$ or $Si_xN_y$ layer of a thermal conductivity of about 0.015 W/cm-K deposited thereon. If a SiC header or heat pipe is used that is electrically conducting (e.g., a doped SiC material), a similar insulating layer can be applied as well.

Since the thermoelements are low voltage, high current devices, the electrical connections are preferably highly conductive having a low resistance (preferably $1/10^{th}$ or less than that of the Ohmic resistance of the thermoelements). A low conductance for the electrical connections will undermine the efficiency of the thermoelectric stage by resistive losses in current flow through the thermoelectric device.

Accordingly, in general, embodiments of the present invention may include a thermoelectric device having a first header (e.g., the upper side header 3) coupled to a heat source, a pair of n-type and p-type thermoelements (e.g., the pair of n and p-type thermoelements 2a and 2b) coupled to the first header and configured to conduct heat from the first header, a second header (e.g., the lower side header 4) coupled to the pair of n-type and p-type thermoelements and configured to conduct heat from the thermoelectric pair, and a heat pipe coupled to the pair of n-type and p-type thermoelements (e.g., the heat pipe 5 connected to the thermoelectric pair 2a and 2b) and elongated in a transverse direction across the thermoelectric device to separate the first header from the second header.

In one embodiment of the present invention, the thermoelectric devices cool the first header (and thus can cool heat dissipating devices coupled thereto) by the flow of an electrical current through electrical connections 6 and 7 through the thermoelements 2a and 2b, thus transporting heat in the electrical carriers (i.e., the electrons and holes) and thereby cooling the first header. In another embodiment of the present invention, the thermoelectric devices generate electrical power by the development of a voltage on the electrical connections 6 and 7 as heat flows from the first header (coupled to a heat source) through the thermoelements 2a and 2b to the second header (coupled to a heat sink).

Further, embodiments of the present invention are not limited to single-stage and/or single pair of thermoelement devices but can utilize multiple stages and/or multiple pairs of thermoelements in a single stage.

Figure 2:
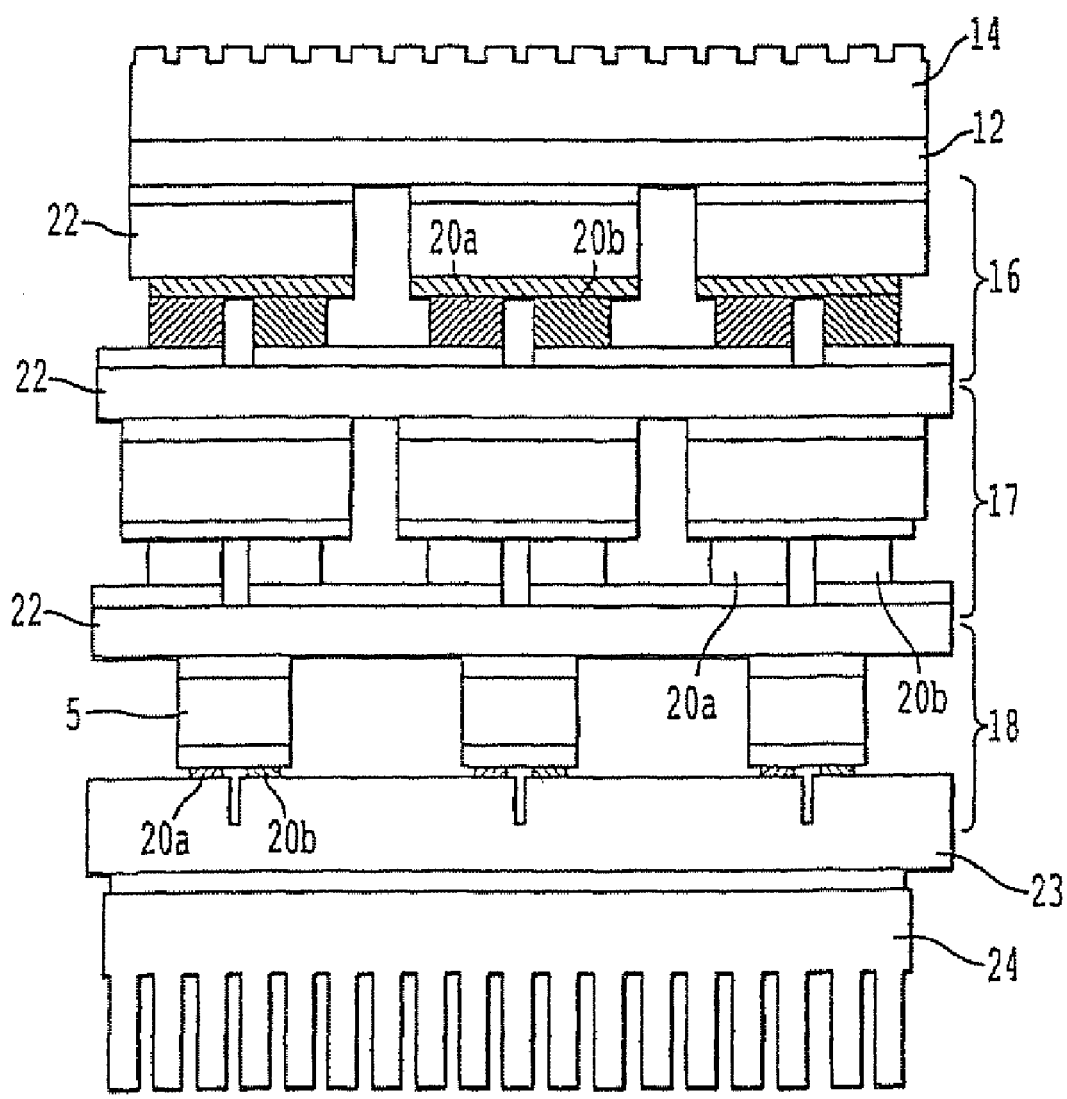
FIG. 2 is a schematic of a multi-stage thermoelectric device according embodiments of to the present invention.

FIG. 2 depicts a multi-stage embodiment of the present invention. Specifically, FIG. 2 is an illustrative schematic of a multi-stage or multi-unit thermoelectric device according to embodiments of the present invention including three thermoelectric stages or units. The device depicted in FIG. 2 is shown by way of example in a configuration for thermoelectric power conversion and, for simplicity, is discussed below only in a context of power conversion. However, the features depicted in FIG. 2 and utilizing multiple stages and/or multiple pairs of thermoelements in a stage are, according to embodiments of the present invention, applicable to thermoelectric cooling as well. Further, the number of stages and the number of thermoelectric pairs per stage are not restricted-to that illustrated in FIG. 2.

As shown in FIG. 2, an upper header 12 is coupled to a heat source 14 and includes at least one upper thermoelectric stage 16 coupled to the upper header 12. Of the thermoelectric stages 16, 17, and 18 depicted in FIG. 2, at least one of the depicted thermoelectric stages is dimensioned such that area for thermal conduction in the thermoelectric stage through a pair of thermoelements 20a and 20b, herein referred to as the active thermal conduction channel area, is smaller than above-noted unit area of header 22 to which the pair of thermoelements 20a and 20b are coupled to. Such dimensioning as discussed with regard to FIG. 1 establishes the HAF-LIOF aspect for the multi-stage thermoelectric device of FIG. 2. As shown in FIG. 2, the upper thermoelectric stage 16 is coupled to at least one lower thermoelectric stage, e.g., stage 17. The lower thermoelectric stage 17 like the upper thermoelectric stage 16 has an active thermal conduction channel area through the pair of thermoelements 20a and 20b that is smaller in area than the unit area of header 22. In the device depicted in FIG. 2, heat is dissipated from the lower-most thermoelectric stage 18 by a heat sink 24 coupled thereto. Accordingly, heat pipes in the various stages also have at least one thermal conduction channel area that is smaller than the unit areas of the associated headers.

In the multi-stage thermoelectric device depicted in FIG. 2, a high internal heat-flux exists within the individual thermoelectric stages (e.g., about 1800 W/cm$^2$ for a ΔT (temperature differential) across each stage of 85K to as high as about 2300 W/cm$^2$ with a ΔT across each stage of 107K). Meanwhile, a low external heat-flux exists across the entirety of the thermoelectric device (e.g., a range from 15 to 30 W/cm$^2$). In a multi-stage device, the packing fraction and hence the active flux through each stage can be different or similar to the active heat flux in other stages.

More specifically, the multi-stage thermoelectric device as illustrated in FIG. 2 can include a high-temperature thermoelectric conversion stage (i.e., the upper thermoelectric stage 16), for example, an N—SiGe/P-TAGS thermoelement pair (e.g., with an about 100 µm active region thickness). TAGS refers to a Tellurium, Antimony, Germanium, and Silver (TAGS) alloy composition. TAGS compositions are in general denoted by $(AgSbTe_2)_{1-x}(GeTe)_x$. One composition according to embodiments of the present invention for x, the GeTe mole fraction, is about 0.80 to about 0.85. As illustrated in FIG. 2, the high-temperature thermoelectric conversion stage is coupled to a mid-temperature thermoelectric conversion stage (i.e., stage 17), for example, an N—PbTe/P-TAGS thermoelement. As illustrated in FIG. 2, the mid-temperature thermoelectric conversion stage is coupled to a lower temperature thermoelectric conversion stage (i e., the thermoelectric stage 18), for example, an n-type and p-type $Bi_2Te_3$- superlattice-thin-film thermoelement pair having a 5 µm (micrometer) to 10 µm (micrometer) in thickness. As shown in FIG. 2, the lower header 23 constitutes a split-header having slits formed partially (in the top side and correspondingly at certain locations on bottom side not shown) in a body of the lower header 23 to provide thermal expansion relief. In one embodiment of the present invention, the splits are preferably not located near the devices.

The three-stage thermoelectric device depicted in FIG. 2 may provide a design efficiency in a range of 20% and electrical power density in excess of 5 W/cm$^2$, and may be capable of power conversion in a range of tens of mWatts to as high as 1 MWatt when coupled to a heat source at temperatures approaching 875K. Design efficiencies in excess of 20% and the capability to operate with hot-sides in the range of 675 to 875K permit flexibility and adaptability to real-world systems. With hot-sides in the range of 675 to 875K, higher Carnot efficiencies are available than would be available, for example, in thermoelectric devices restricted to hot-sides of 375K to 575K. In turn, higher Carnot efficiency provides for higher system efficiencies which in turn facilitates load balancing by reducing the number of modules (i.e., the number of thermoelectric pairs) required to convert a given heat flux into electrical power.

Materials Selection

While the concepts according to embodiments of the present invention are not restricted to any particular family of thermoelectric materials, the use of superlattice materials may improve thermoelectric device efficiency of the multi-stage thermoelectric device. Conventional bulk $Bi_2Te_3$ thermoelectric devices offered by Hi-Z Inc. (San Diego, Calif.) exhibits a power density of 0.34 W/cm$^2$ at a $\Delta T$ (temperature differential) of 200K for a specific power of about 0.165 W/gm. Yet, even unoptimized thin-film $Bi_2Te_3$-superlattice mini-module devices fabricated by the HAF-LIOF aspect according to embodiments of the present invention, even without the mid and high temperature thermoelectric power conversion stages discussed above, have demonstrated a power density of 0.7 W/cm$^2$, with a $\Delta T$ (temperature differential) of 77K, and a specific power of 16.7 W/gm. Specific power is defined as the power produced per unit weight of the thermoelectric device. Both the specific power and the power density levels would increase with the addition of mid and high-temperature stages and further optimization of the low-temperature superlattice stage. Accordingly, thermoelectric devices according to embodiments of the present invention may realize a specific power greater than 1 W/gm and a power density greater than 0.5 W/cm$^2$.

On the other hand, specific powers in a range of less than 0.0001 W/gm, 0.001 W/gm, and 0.01 W/gm, are possible according to embodiments of the present invention and are applicable to applications such as, for example, bio-medical devices. In these applications, the HAF-LIOF devices could be used for heat gathering from low temperature sources in a range of about 30 degrees C. to about 40 degrees C. such as the human body to power pacemakers or neuro-stimulators used to alleviate symptoms of Parkinson's disease or other neurological disorders.

Figure 3:
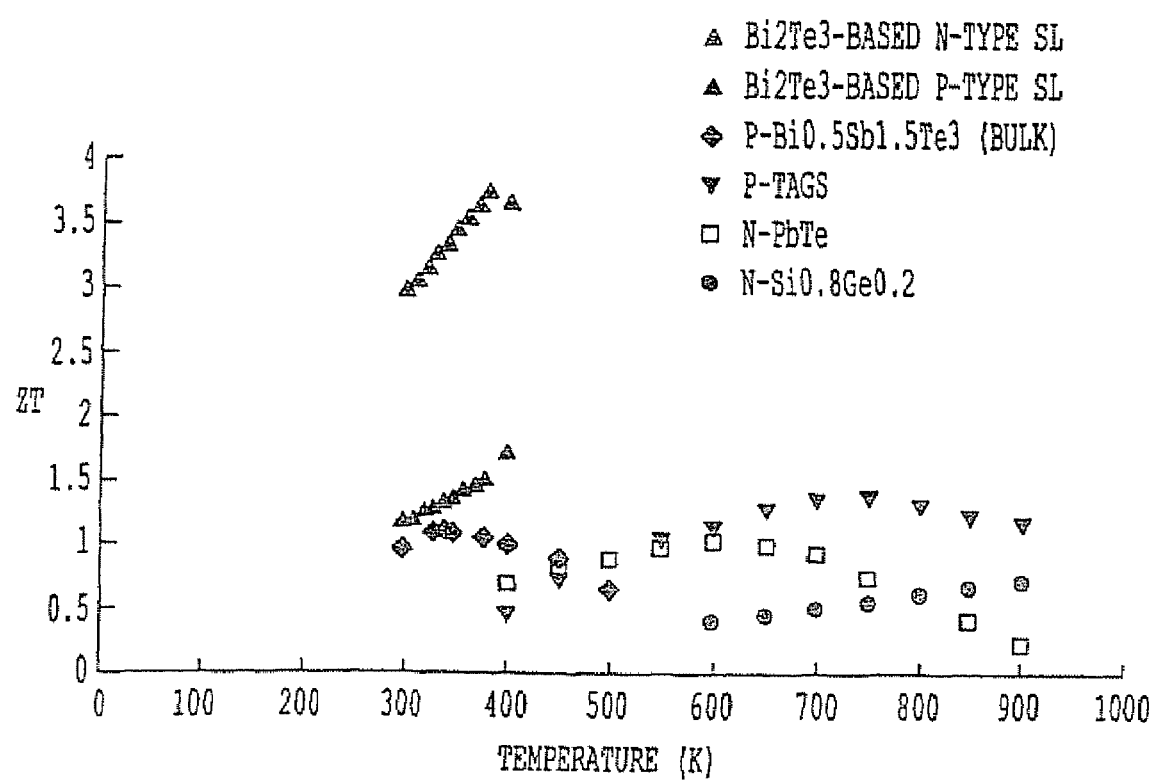
FIG. 3 is a graph depicting variations of ZT with temperature for various material systems useful according to embodiments of the present invention.

FIG. 3 is a graph depicting variations of ZT with temperature for various material systems useful according to embodiments of the present invention. Knowledge of the variation of ZT with temperature in suitable temperature-stable-material systems, such as shown in FIG. 3, permits appropriate materials selection for the above-described multi-stage design. The material selections should, according to embodiments of the present invention, provide a material for each thermoelectric stage which is robust in the temperature range in which the thermoelectric stage is intended to operate. For example, devices in PbTe/PbSe and Si/Ge superlattice material systems would be useful for a temperature range of 475K to 675K and 675K to 875K, respectively, according to embodiments of the present invention.

The relevant properties, the lattice-mismatch and the bandgaps, of the PbTe/PbSe superlattice system are shown in Table 1 of FIG. 23. Both materials PbTe and PbSe have similar thermal expansion coefficients; so that lattice mismatch at higher temperatures would be similar to that at 300K. Also, kT at the temperatures of 500 to 650K is about 0.05 eV, comparable to or larger than the bandgap difference between PbTe and PbSe. Thus, no barriers or quantum confinement effects will be present within the material, but a significant thermal conductivity reduction is expected in these superlattice materials.

Regarding the SiGe materials family, Si/Ge superlattice materials, according to embodiments of the present invention, are attractive for high temperature applications (i.e., 650K to 850K). For example, Si/Ge superlattice materials deposited at about 1000K-have shown a dramatic reduction in thermal conductivity and concomitantly an enhancement in ZT. Although Si/Ge superlattices may only offer a ZT of only about 0.8 at 300K, significantly below that of a $Bi_2Te_3$/$Sb_2Te_{3x}$ superlattice or a $Bi_2Te_3$/$Bi_2Te_{3-x}Se_x$ superlattice, the Si/Ge superlattices are likely to offer a much higher ZT at the higher temperatures employed in the upper thermoelectric stages depicted in FIG. 2. Further, the SiGe superlattices will have higher ZT values than associated SiGe alloys of the same Ge concentration, leading to higher efficiencies. Indeed, development of high ZT thin films in the PbTe/PbSe and in the SiGe material systems have been described by M. Lee et al. in Appl. Phys. Lett., 70, 2957 (1997) and R. Venkatasubramanian, Phys. Rev. B 61, p. 3091 (2000) and by R. Venkatasubramanian et al. in Proc. of 17th International Conference on Thermoelectrics, 191, (1998), the entire contents of which are incorporated herein by reference.

In addition to superlattices, other quantum-confined structures and structures can be utilized according to embodiments of the present invention in which a strong thermal conductivity reduction is obtained while at the same time maintaining electrical conduction across the thermoelectric stages. For example, PbTe-based quantum-dot superlattices (QDSL) are suitable materials for the n and p-type thermoelements according to embodiments of the present invention. ZT values for these materials are achievable in a range of 1.5 to 2, in the temperature range of 450 K to 550 K.

Furthermore, even ZnSb and skutterudites, (i.e., materials with a known ZT>1 over a temperature range suitable for power conversion) are also applicable according to embodiments of the present invention provided these materials are in thin substrate form (i.e., in a thickness of 100 to 200 μm) and are used in a temperature range of 500K to 900K. Thus, the HAF-LIOF, high-power density, multi-stage power conversion device concept according to embodiments of the present invention is not limited to $Bi_2Te_3$-superlattice/PbTe/SiGe material combinations.

Indeed, superlattices of Si/Ge, PbTe/PbSe, ZnSb/CdSb, InAs/InSb, CdTe/HgCdTe, $Ga_xIn_{1-x}As/Ga_yIn_{1-y}As$ can be used in the high-temperature and mid-temperature thermoelectric conversion stages, discussed above, thus providing a cascade thermoelectric device utilizing all superlattice materials.

Figure 4:
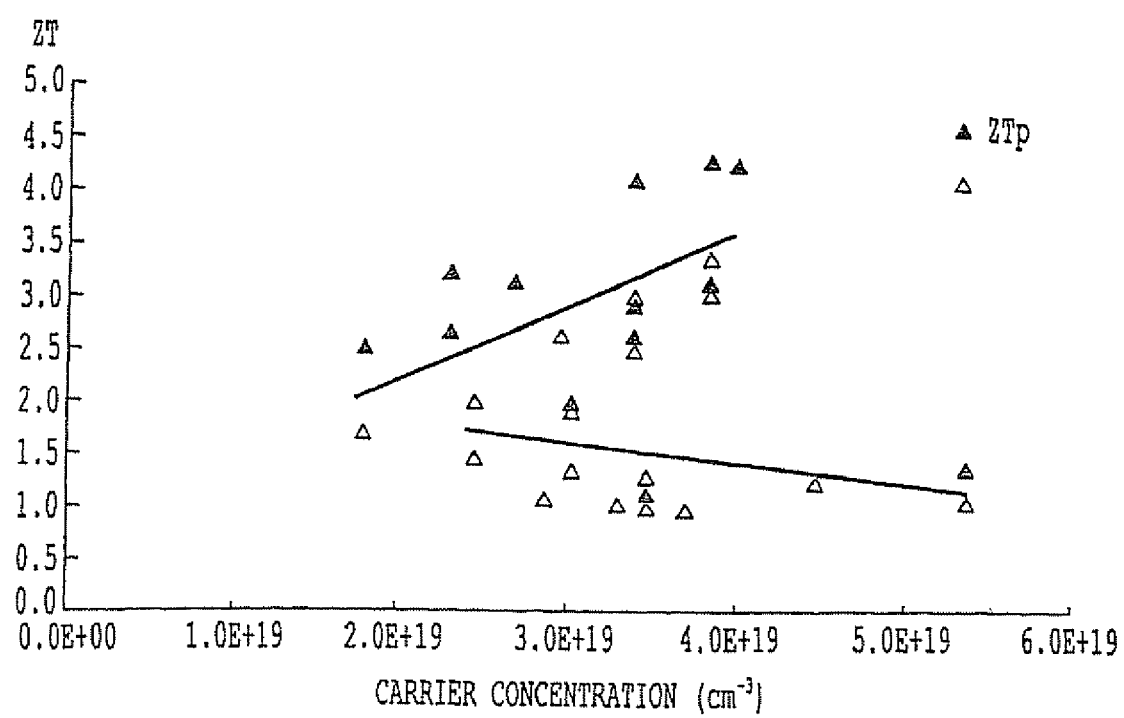
FIG. 4 is a graph depicting state-of-the-art ZT vs. carrier concentration for p and n-type $Bi_2Te_3$-based superlattice elements according to embodiments of the present invention.

For the lower temperature thermoelectric conversion stages according to embodiments of the present invention and for single stage cooling devices operating near room temperature, superlattice stages of $Bi_2Te_3$-$Sb_2Te_3$ can be used. FIG. 4 is a graph depicting state-of-the-art ZT vs carrier concentration for p and n-type $Bi_2Te_3$-based superlattice elements.

FIG. 4 shows a ZT of about 3.5 in p-type superlattices and of about 2.0 in n-type. According to embodiments of the present invention, by control and engineering of dopant carrier levels, the 300K figure-of-merit (ZT) achievable with p-type $Bi_2Te_3/Sb_2Te_3$ and n-type $Bi_2Te_3/Bi_2Te_{2.7}Se_{0.3}$ superlattice device elements is improved from previously known values of about 2.4 and about 1.2 to values greater than 3.5 and about 2, respectively. The carrier levels in the p-type materials as shown in FIG. 4 are controlled by varying the organometallic Tellurium flow-rate during growth, for a fixed growth rate of the superlattices which in turn can be controlled by the flow-rate of the organometallic Bismuth for $Bi_2Te_3$ and organometallic Sb for $Sb_2Te_3$. The carrier levels, for a constant growth rate, can also be controlled by control of growth temperature over a limited range. For the n-type materials, the doping levels as shown in FIG. 4 can be controlled by the growth rates of $Bi_2Te_3$ and $Bi_2Te_{2.7}Se_{0.3}$ layers in the superlattice as well as the growth temperatures. A value of peak ZT of about 2.9 demonstrated according to embodiments of the present invention for a 10 Å (Angstrom)/50 Å (Angstrom) p-type $Bi_2Te_3$-$Sb_2Te_3$ superlattice is one of the highest peak ZT values observed at 300K for the p-type $Bi_2Te_3$-$Sb_2Te_3$ superlattice material system. Such improvements in ZT may permit improved power conversion efficiencies and cooling efficiencies for the thermoelectric devices according to embodiments of the present invention.

Device Performance

According to embodiments of the present invention, the advances in ZT for the p and n-type superlattice materials have been incorporated into fabricated p-n thermoelement couples. By flipping the fabricated p-n couples onto a split semi-infinite Cu-plate as opposed to flipping the fabricated p-n couples onto a header with a limited-thickness metallization, a more accurate measure of the thermoelectric properties of the fabricated p-n thermoelement couples is possible. For instance, each one of the p-n thermoelement couples potentially carries a high-current (i.e., several Amps of current) and is a low-voltage thermoelectric device. Parasitic lead resistances can therefore affect the measured device efficiencies. Properties of the p-n thermoelement couples have been developed by fabrication and analysis of the p-n thermoelement couples on a split semi-infinite Cu-plate. In the fabricated thermoelectric devices, electrical contact resistances in the thermoelectric devices may be reduced and/or minimized between the metallizations and the p-n thermoelement couples, providing adequate electrical interfacing.

In addition to managing electrical contact resistances, thermal interface resistances may be reduced in the metal-to-dielectric interfaces according to embodiments of the present invention by deep-annealing of a metal into the dielectric bulk or by utilizing an AlN-diffused Al—Cu interface.

Further, high aspect-ratio thermoelectric devices (either with thicker superlattice films or smaller-area devices) are provided by appropriate patterning and etching of the p-n couples (e.g., the thermoelectric pair 2a and 2b). An aspect ratio of the element is defined as the ratio of thickness/area of element in units of $cm^{-1}$. Typical thickness of thermoelectric elements in the low-temperature stage can be about 5 μm to 20 μm (microns), while the mid and high temperature stages can have thicknesses ranging from 50 μm to 250 μm (microns). The aspect ratio, hence the area of each element of the various stages, are based on the thermal conductivity of the materials (noting that the thermal conductivities of the p and n-type elements within a stage can be different and so their aspect ratios to allow same ΔT (temperature differential) across both p and n-type elements of each stage can be different) of the various stages and the required ΔT (temperature differential) for each stage for increasing and/or maximizing the efficiency of the overall set of stages. The ΔT (temperature differential) of each stage is inversely proportional to thermal conductivity of the material and directly proportional to the aspect ratio. Hence, according to embodiments of the present invention, the total heat flux through each stage is same; thus the aspect ratio (and the associated packing fraction) in each stage is adjusted with this criterion to meet the design ΔT (temperature differential) for each stage.

Power conversion efficiencies achievable in, for example, the three-stage thermoelectric devices according to embodiments of the present invention are calculable based on known equations. The maximum efficiency is obtained when the load ratio r, defined as $R_L/R_G$ with $R_L$ being the load resistance and $R_G$ being the thermoelectric device internal resistance, is optimized for average ZT over the entire temperature range, $ZT_m$ See, for example, H. J. Goldsmid, Electronic Refrigeration, Pion Limited, (1986).

Once r is known as per eqn. (1) shown below, the device efficiency ψ can be obtained by eqn. (2), shown below for a given ΔT (temperature differential), and mean operating temperature $T_m$.

$$r = (1+ZT_m)^{1/2} \quad (1)$$

$$\psi = \Delta T / \{[(r+1)/(r-1)] * T_m + \Delta T/2\} \quad (2)$$

Power conversion efficiency estimates are shown in Table 2 of FIG. 5, for a range of ZT values for each stage. The power conversion efficiency estimates are shown in a range from upper to midrange to lower projected values. The projections in Table 2 indicate that an efficiency in the range of 9.6% to 11.4% for a ΔT (temperature differential) of 150° C. in the low-temperature $Bi_2Te_3$-SL-based stage can be realized for a ZT value of 2 to 2.5.

An efficiency in the range of 4.3 to 4.7% for a ΔT (temperature differential) of 175 to 200° C. in the n-PbTe/p-TAGS-based thin N—PbTe/P-TAGS thin-substrate mid-temperature stage can be realized for a ZT of –0.75. An efficiency in the range of 3.4 to 3.7% for a ΔT (temperature differential) of 200° C. N—SiGe/P-TAGS thin-substrate high-temperature stage can be realized for a constant ZT of about 0.75. Thus, according to embodiments of the present invention, a thermoelectric efficiency of about 19.4% to 17.7% and a power density in excess of 5 W/cm² may be obtainable in three-stage thermoelectric power conversion devices.

Indeed, Table 2 illustrates the performance of various stages of a three-stage thermoelectric device according to embodiments of the present invention as a function of ZT and the efficacy of thermal management at the heat-sink. The calculations in Table 2 are based on a module size of approximately ~33 cm². For these examples, a heat flux of 30 W/cm² is assumed to flow from the heat-source (i.e., the upper-most header) to the heat sink (ie., the lower-most header), yielding a heat-flux dissipation range of about 24.7 to 22.7 W/cm² at the heat-sink. The power densities are calculated assuming a 5 μm thick superlattice element in the low-temperature $Bi_2Te_3$-super lattice stage and assuming a 100 μm thin-substrate for bulk thermoelements in the mid and high temperature stages. Table 2 indicates that higher ZT materials for both the mid-stage (460K to 660K) and high-stage (670K to 890K) may be advantageous.

For a given heat flow Q, in Watts, the aspect ratio determines the ΔT (temperature differential). The efficiency is a function of ΔT (temperature differential) and ZT. The power generated P, in Watts, is a product of Q times efficiency. Thus, power density, Pd, is a function of both area, thickness, ZT and Q. Hence, according to embodiments of the present invention, one approach to achieve power densities of greater than 20 W/cm² is to use thinner sections of thermoelement materials (e.g., preferably less than 300 um).

Calculations of thermal-to-electrical conversion efficiency, corrected for lead resistances, versus internal ΔT (temperature differential) across the flipped inverted p-n couple, and the ZT obtained from the efficiency equations indicate that about 85% of the external ΔT (temperature differential) (and consequently the heat flux) is applied across the device. The 15% loss is primarily due to the thermal interface resistance between the metallization and the AlN header.

According to embodiments of the present invention, the thermal interface resistance can be reduced in the metal-to-dielectric interface by deep-annealing of the metal into the dielectric bulk or by utilizing an AlN-diffused Al—Cu interface, as discussed above.

Calculated ZT values of the inverted couples utilized for demonstration of the power conversion concepts according to embodiments of the present invention were about a ZT value of 1.1 at 300K. The average ZT of the p-n couple according to embodiments of the present invention (e.g., the thermoelectric pair 2a and 2b) increases with temperature, consistent with the general trend of ZT shown in FIG. 3.

One p-n couple according to embodiments of the present invention was tested up to a ΔT (temperature differential) of nearly 85K, corresponding to an active device heat flux within the thermolement of about 1800 W/cm.

For this tested p-n couple, the external heat flux was about 28 W/cm² with a temperature rise of about 28K at the heatsink. Application of improved thermal management practices to operate even this test device with a ΔT (temperature differential) of 150K, even with the present ZT of about 1.5, may permit an efficiency of about 8.6% to be realized. Improvements in ZT values from 1.5 to about 2 may realize according to embodiments the present invention efficiencies of about 11% for a ΔT (temperature differential) of 150K.

According to some embodiments of the present invention, systems for thermoelectric power conversion may be provided. The system includes a thermoelectric pair of n-type and p-type thermoelements, a first header coupled to one side of the thermoelectric pair, a second header coupled to a second side of the thermoelectric pair, a thermal impedance increasing device disposed between the thermoelectric pair and one of the first and second headers, and a heat sink coupled to the second header which dissipates heat at a rate which maintains a temperature of the second header below a temperature of the first header. Further, a coupling member can be used to couple the first header to a heat source. The heat source can be a combustion source, a radioactive source, a solar-heated source, and an electrical power device. The coupling member in one embodiment of the present invention can be a thermally conducting member having a thermal conductance of at least Al and extending between said first header and said heat source. Alternatively, the coupling member can be a steam pipe or a combustion exhaust pipe transporting heat flux by a convective medium such as, for example, steam or combustion gases.

Figure 6A:
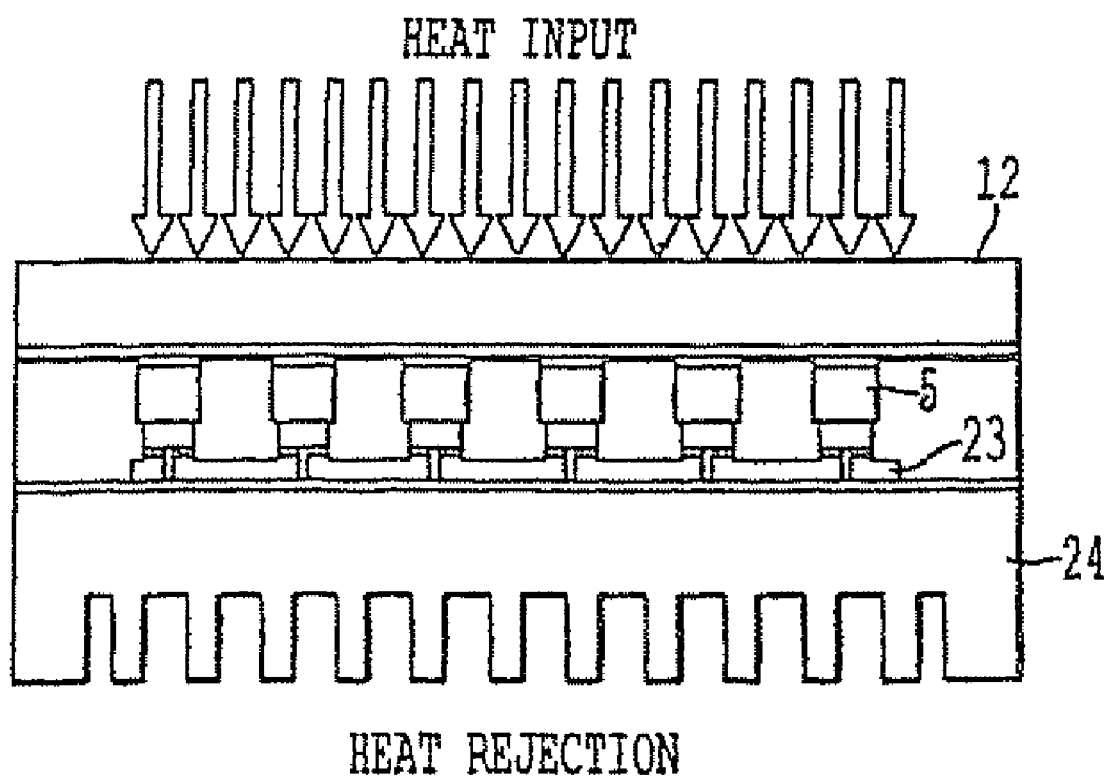
FIG. 6A is a schematic illustration depicting a thermoelectric device module according to embodiments of the present invention integrating a series of p-n couples on a single stage.

FIG. 6A is a schematic illustration depicting a thermoelectric device module according to embodiments of the present invention integrating a series of p-n couples on a single stage. Tests on p-n couple devices for open-circuit voltage (Voc), power (P), and power density (Pd in W/cm²) are shown in FIG. 6B. Tests on an integrated 16 p-n couple devices show expected open-circuit voltage (Voc), power (P), and power density (Pd in W/cm²). In particular, the open-circuit voltage has been observed to scale in the thermoelectric module to almost sixteen times that of a single-couple, for similar ΔT (temperature differential) to the individual p-n couple, further supporting the HAF-LIOF concept. The power levels of 38 mW per couple, for a 600 μm (micrometer)×600 μm (micrometer) device and for a ΔT (temperature differential) of about 107K correspond to an electrical power density of as much as about 10.2 W/cm². The power level scales to 166 mWatts per couple for the 16-couple module for a ΔT (temperature differential) of 77K.

Both p-type and n-type thin-film superlattice thermoelements according to embodiments of the present invention have been stable. Exposures to temperatures of about 450K and times of up to 60 hours have showed no marked deterioration in the device ZT of these elements, as shown in Table 3 of FIG. 24.

Besides superlattices, device fabrication methodologies and HAF-LIOF aspects according to embodiments of the present invention are applicable to thin substrates from two non-superlattice material systems, GaSb and InAs, corresponding to the bandgaps of the n-SiGe/p-TAGS and n-PbTe/p-TAGS systems. Open-circuit voltage as a function of ΔT (temperature differential) in a 100 element GaSb and InAs thin-substrate module according to embodiments of the present invention may be capable of Voc values of about 4.5 Volts to about 3.5 Volts and are capable to generate ΔT (temperature differential) in excess of 100K, corresponding to active heat fluxes of about 300 W/cm², to achieve high electrical power densities.

Manufacture of the Thermoelectric Devices and Modules

Various methods are available for the manufacturing of the devices and the device components according to embodiments of the present invention. Given below for purposes of illustration are steps and methods involved in fabricating the individual p and n-type thermoelectric pairs according to embodiments of the present invention and are steps and methods for integration of the thermoelectric pairs into modules. The steps and method described below are illustrative and are not given to imply any limitations according to embodiments of the present invention.

The thermoelectric materials utilized as the p and n-type thermoelements according to embodiments of the present invention are typically overgrown films on commercial substrates, the overgrown films having a thickness of, for example, 5 μm (micrometers) to 20 μm (micrometers). Substrates for the growth of, for example, the thin-film superlattices or other thin film thermoelectric structures, may have the same conductivity type as the overgrown films or may permit the overgrowth of opposite conductivity type films. The overgrown films can be metallized to provide a low-resistance contact, such as a low-resistance Peltier contact.

In one fabrication method according to embodiments of the present invention, fabrication of thermoelectric devices may be facilitated by inverted-couple processing. Table 4 shown in FIG. 6C illustrates the inverted processing approach according to embodiments of the present invention. In inverted-couple processing, one leg of a p thermoelement and one leg of an n thermoelement are attached a common electrical member adjoining the two elements. Fabricating the individual n-type and p-type thermoelements in each leg of the thermoelectric power conversion stages can occur in one example according to embodiments of the present invention by forming n-type and p-type films on separate substrates, and then attaching the individual n-type and p-type thermoelements to a common header.

Alternatively, films of a specific type can be formed on a common substrate and then different regions of the formed thermoelectric material can be selectively converted (e.g., by selective ion implantation) into n-type and p-type regions. For example, the thermoelements could be formed intrinsic (or specifically doped) and then type-converted to another (i. e., a p-type to n-type conversion or an n-type to p-type conversion) by, for example, impurity-diffusion. Type-conversion would then be performed at a convenient stage in the manufacturing process. Regardless of the specific details, a set of p and n-type materials having a pre-arranged pattern are attached to a common header like SiC, AIN, low-resistivity silicon, and silicon with a thin insulating layer.

In one fabrication method according to embodiments of the present invention, substrates including the individual n-type and p-type thermoelements are separated, for example, by scribing or laser dicing, into individual segments. The individual segments are then bonded onto a header such that alternating n-type and p-type conductivity materials exist between each adjacent thermoelement. The surfaces of the header that come in contact with the n-and p-type segments are preferably metallized prior to assembly to provide low-resistance electrical connection between adjacent n-and p-type segments where necessary to electrically interconnect adjacent thermoelements. Likewise, the surfaces of the individual n-type and p-type thermoelements that come in contact with the header are preferably metallized prior to assembly to provide the necessary low-resistance electrical connection to the n-type and p-type thermoelements, else a high electrical contact resistance can limit the efficiency of the thermoelectric stage and the resultant thermoelectric device.

Following the bonding of n-and p-type segments, the substrates from each of the p-and n-segments are selectively removed, for example, by using selective etchants. The thermoelements are then patterned using photolithographic patterning followed, for example, by etching, or by laser ablation, to produce a desired cross-sectional thermal conduction area according to embodiments of the present invention (i.e., to set the aspect ratio and ultimately determine the packing fraction). Low resistivity contact metallizations are then evaporated on an upper surface of the n-and p-type thermoelements. In this step, either the same metallization can be used for both of the n-and p-type section, or different metallizations can be used (i.e., separate evaporations), depending on the contact resistance requirements. Sheet resistances, or conductances as specified above, associated with the metallizations are designed not to restrict the performance of the thermoelectric devices.

Figure 1B:
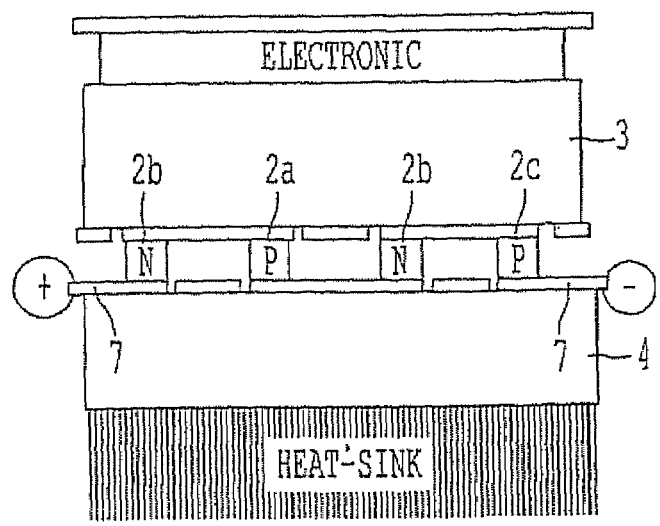
FIG. 1B is a schematic of a thermoelectric device according to embodiments of the present invention operating in a High Active Flux-Low Input-Output Flux mode.

A top, pre-patterned metallization header can, in one embodiment of the present invention, be attached to the metallized sections to function as the aforementioned heat pipe. Alternatively, the header itself prior to metallization can be patterned to provide the aforementioned heat pipe. The formed pair of thermoelements (i.e., the n-thermoelement and the p-thermoelement) including the attached header can then be flipped and bonded to a second header. The second header, referred to for the purpose of illustration as a bottom header, thermally connects the n thermolelement to the p-thermoelement, but contains patterned electrical connections such that electrically the n thermoelement and the p-thermoelement are individually connected, as shown in FIGS. 1A and 1B. The bottom header thus functions as an electrical member having, as shown in FIGS. 1A and 1B, a split electrical contact (i.e., an electrical contact only contacting individually the n-type and p-type thermoelements), while as a thermal member the bottom header functions as a continuous thermal contact.

Regardless of the formation approach (i.e., direct deposition or bonding), thick metallizations and pattering can be used, according to one embodiment of the present invention, to form the noted bottom header and to provide the aforementioned split electrical contact. Direct attachment by deposition or bonding would permit a large number of patterned thermoelements each possessing the requisite thermal conduction area to be fabricated and electrically connected in series to provide either an output electrical contact for power conversion or for cooling. Subsequent stages of thermoelectric devices could then be added using similar procedures, or by attaching subsequent pre-fabricated stages, or by attaching selective members of subsequent stages.

One illustrative example of inverted couple processing is given below:

P-type and n-type superlattice thermoelectric films are deposited on GaAs substrates. The deposited superlattice films are patterned with Cr/Au/Ni/Au metallizations. The deposited superlattice films and/or the GaAs substrates are etched in preparation for dicing. Diced strips of the p-type and n-type superlattice films attached to the GaAs substrates are then bonded in an alternating conductivity type pattern to a header. The header includes an AIN substrate having Ti/Au metallization (annealed) and having a subsequent Cu/No/Au topmost metallization. A Sn preform bonds the diced strips to the AIN substrate (functioning as a first header). The GaAs substrate is then etch removed, and Cr/Au/Ni/Au contacts are evaporated through shadow masks or evaporated and patterned to form electrical contacts to the superlattice thin films. Thick metal pads are then formed on the evaporated contacts to define, for example, a heat pipe structure. Dies containing the superlattice thin films and the attached AIN header are placed and bonded to a separate split metallized header (functioning as a second header) allowing for individual electrical connection to each of the n-and p-type thin film thermoelements.

By way of example, Table 5 depicts various bonding steps used to fabricate the three stage device shown in FIG. 2. As depicted in Table 5 of FIG. 22, in stage 3 of the thermoelectric device (i e., the uppermost header), a preferred heat spreader is AIN or Si. In this stage, a AgCu eutectic is used as a solder material for bonding the heat spreader to the metallization layers on the afore-mentioned N—SiGe/P-TAGS thermoelements. Metallization layers on the N—SiGe/P-TAGS thermoelement pair include silver having a typical diffusion barrier layer of W or Mo or Ni or similar refractory metal to reduce and/or prevent diffusion of Ag into the N—SiGe and P-TAGS materials.

As depicted in Table 5, in stage 3 of the thermoelectric device, a preferred heat spreader is SiC. In this stage, a Sn eutectic is used as a solder material for bonding the heat spreader to the metallization layers on the afore-mentioned n-and p-type $Bi_2Te_3$-superlattice-thin-film pair. Metallization layers on the n-type and p-type $Bi_2Te_3$-superlattice-thin-film pair include Cu having a diffusion barrier layer of Ni or a similar metal to reduce and/or prevent diffusion of Cu into the N—$Bi_2Te_3$ SL and/or P-type $Bi_2Te_3$ SL materials.

As depicted in Table 5, the uppermost stage (i.e., stage 3) can be bonded to the heat-source header (e.g., a Cu plate) using a AgCuP eutectic bond. Stages 2 and 3 can be eutectic bonded together using a AuIn eutectic. Stages 1 and 2 can be eutectic bonded together using a SnAu eutectic. Stage 1 can be bonded to the heat-sink header (e.g., an Al plate) using an InSn eutectic bond. Hence, according to embodiments of the present invention, successively-lower-melting-point eutectics may bond the successive stages so that the previously-bonded stages are in tact. Such measures serve to match or reduce the mismatch in the coefficients of thermal expansion between the various stages as successive bonding can cause thermal stress.

An example of stacking of the various stages to obtain efficient thermal interfaces between each of the adjacent stacks by using eutectic metal bonding is described by R.

Venkatasubramanian et al in Appl. Phys. Lett., Vol. 60, 886 (1992), the entire contents of which are incorporated herein by reference.

Figure 7A:
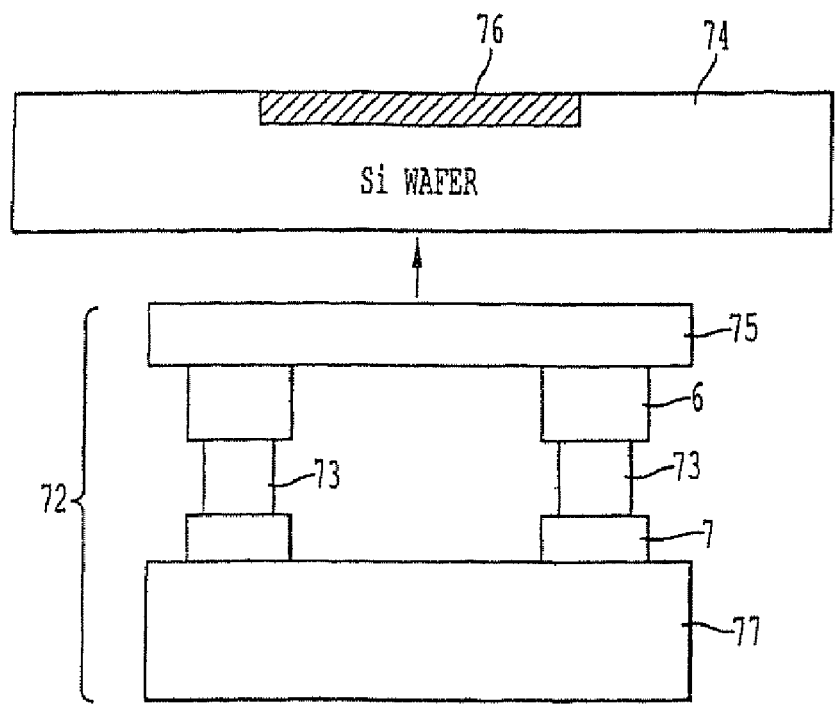
FIG. 7A is a schematic depicting attachment of a pre-fabricated thermoelectric device according to embodiments of the present invention onto a semiconductor device chip.

Integration of Thermoelectric Devices and Modules to Semiconductor Chip Packages A thermoelectric device according to embodiments of the present invention can be attached to an integrated circuit die or wafer element (preferably to the backside) with or without an intervening layer of thermal grease or plastic adhesive. For direct attachment without intervening layers of thermal grease or plastic adhesive, a thin electrically insulating layer or a series of back-side p-n isolation junctions can be utilized to permit electrical isolation of the integrated circuit on the die from the currents flowing in the thermoelectric devices. In this approach, the "top" header joining the thermoelectric device according to embodiments of the present invention to the integrated circuit die is made of thick metallizations which form the electrical contact and the heat pipe to the p-n thermoelements. Suitable thermoelectric materials deposition/attachment/formation, type conversion, and patterning form the p-n thermoelements and the heat pipe structures. Subsequent metallizations complete a "bottom" header and provide in one embodiment of the present invention a place for attachment to a heat sink device (e.g., an air-cooled plate or a heat-pipe) FIG. 7A is a schematic depicting the bonding of a pre-fabricated thermoelectric device 72 to a semiconductor device chip 74. In this approach, bonding is used to bond the pre-fabricated thermoelectric devices to an integrated circuit die. As such, this approach separates the thermoelectric device fabrication steps from the semiconductor device chip. In this approach, a number of bonding techniques (to be discussed below) can be used to join an upper header 75 of the pre-fabricated thermoelectric device 72 to the semiconductor device chip 74. Accordingly, in the attached structure, heat from power dissipating devices 76 in the semiconductor device chip 74 will be pumped through the thermoelements 73 and dissipated at a heat sink (not shown) attached to the lower header 77.

Figure 7B:
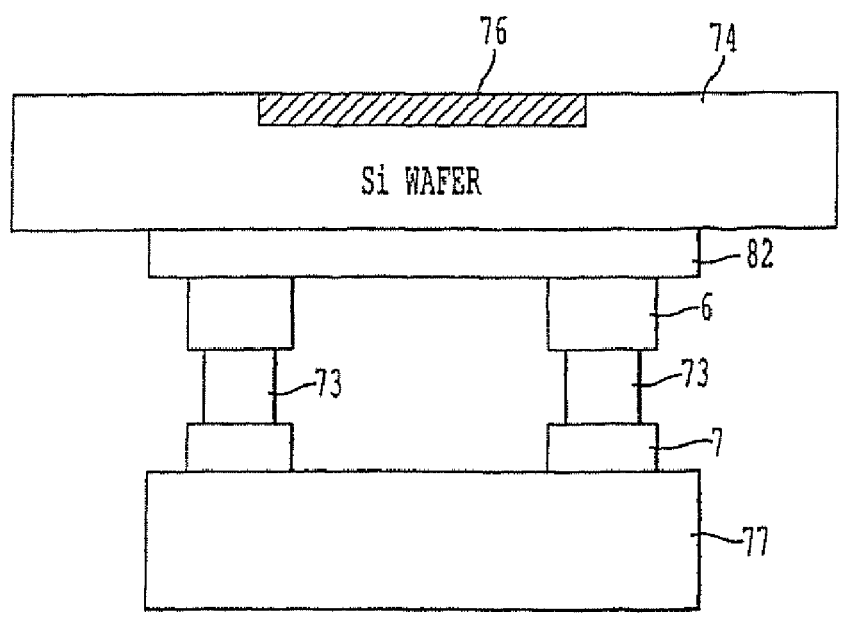
FIG. 7B is a schematic depicting attachment of a thermoelectric device according to embodiments of the present invention onto a semiconductor device chip.

FIG. 7B is a schematic depicting the attachment of a thermoelectric device without a top header onto a semiconductor device chip according to embodiments of the present invention. Specifically, FIG. 7B depicts the bonding of pair of thermoelements 73 to the semiconductor device chip 74. As shown in FIG. 7B, the bonding to the semiconductor device chip 74 is facilitated by the pre-deposition or growth of an electrically insulating layer 82 on the semiconductor device chip 74 (e.g., silicon dioxide formation on a Si device wafer). As shown in FIG. 7B, the semiconductor device chip 74 itself serves as a header spreading heat from power dissipating devices 76. Thus, in this embodiment of the present invention, the thermoelements are attached directly to the semiconductor device chip 74 without the utilization of a top header.

Figure 7C:
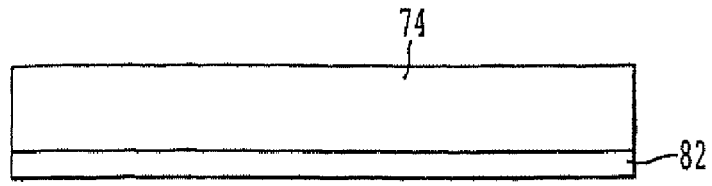
FIG. 7C(a)-(e) are schematics depicting sequential formation of a thermoelectric device according to embodiments of the present invention onto a semiconductor device chip.
Figure 7C:
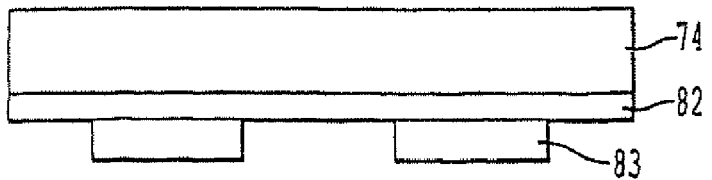
Figure 7C:
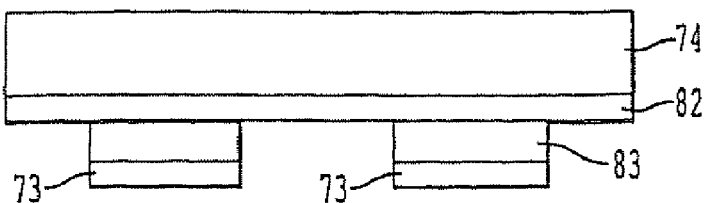
Figure 7C:
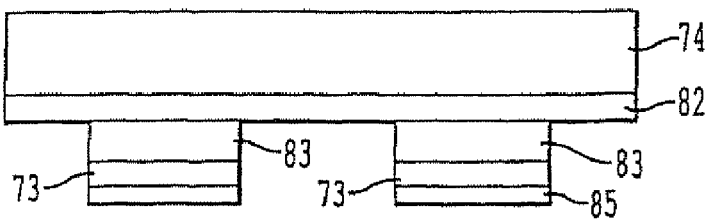
Figure 7C:
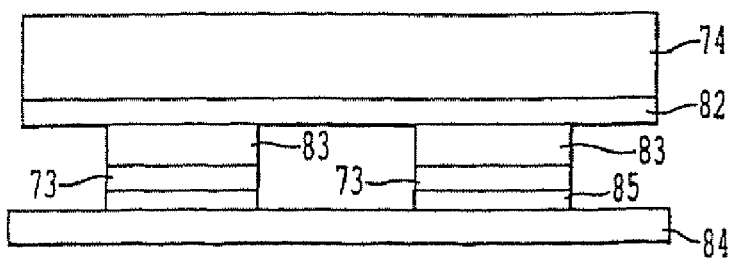

FIG. 7C is a schematic depicting the sequential formation of a thermoelectric device 72 onto a semiconductor device chip 74 according to embodiments of the present invention. In this approach, the fabrication process may utilize bonding at separate steps in the process to bond thermoelectric materials and/or superlattice layers to other layers of the thermoelectric device, and to provide a mechanism for direct attachment of the thermoelectric devices to the semiconductor device chip 74.

In the simplified process depicted in FIG. 7C, at step (a), an electrically insulating layer 82 is formed on the semiconductor device chip 74. The layer 82 can be a thermal oxide grown on a Si device chip; the layer 82 can be a deposited oxide such as $SiO_2$ or $Si_3N_4$ deposited, for example, by sputtering or vapor deposition. At step (b), metallizations 83 (including interconnections between the thermoelements not shown for the sake of simplicity) are deposited and patterned in accordance with the layout of the thermoelectric devices 72 on the semiconductor device chip 74. The metallizations 83 can include, for example, structures to form the heat pipe 5, described in FIG. 1. At step (c), pair of thermoelements 73 are attached (deposited or bonded) to the metallizations 83. The pair of thermoelements 73 can include, for example, the features of thermoelectric device 1 shown in FIG. 1. At step (d), a set of metallizations 85 are formed on thermoelements 73. At step (e), contact and annealing using the procedures detailed below complete the fabrication by joining a header 84 to the metallizations 85.

Accordingly, various approaches according to embodiments of the present invention include:

(1) attaching a pre-fabricated thermoelectric module to a device wafer, (2) building a thermoelectric device from the backside of a device wafer, or (3) building a part of a thermoelectric device onto the backside of a device wafer (e.g., building heat pipes onto the backside of a device wafer), and completing fabrication by attachment of remaining pre-fabricated components.

For attachment, several attachment methods can be used including: (1) soldering, (2) brazing, (3) friction bonding, and (4) insulator-insulator bonding similar to wafer bonding. Furthermore, in a preferred embodiments a hybrid "reactive" bonding process is utilized in which insulator surfaces, having a thin reactive metal layer, are placed opposed to one another and then contacted and heated to react the metal layer with the insulator surfaces and thereby bond the opposed components together. Such a metal include, for example, Ti, W, Cr, Mo, etc. , or alloys thereof. These metals readily oxidize and form in some embodiments silicides which melt at temperatures of 300° C. or less. The hybrid reactive bonding process according to embodiments of the present invention may rely on the reactivity of the thin metal layer with the respective insulators to achieve a bond. In one embodiment of the present invention, the metal layer is preferably thin (e.g., less than 500 Angstroms) such that all of the reactive layer is consumed, or reacts with, the insulating layers. In hybrid reactive bonding, bonding is achieved when the surfaces are brought into contact and then heated such that the metal reacts with one or both insulating surfaces.

Furthermore, friction bonding according to embodiments of the present invention can be used to bond thermoelectric materials and/or superlattice layers to other layers on the thermoelectric device and provide a mechanism for direct attachment of the thermoelectric devices according to embodiments of the present invention to an integrated circuit die or wafer element. Friction bonding can, in one embodiment of the present invention, be implemented with intervening reactive layers. In friction bonding, linear motion over a short distance using an ultrasonic transducer provides the friction necessary to produce heating at the surface that will produce the bond. Heating to a high fraction of the melting temperature and then using a friction bonding technique to produce local heating and thereby for instance melting or plastic deformation at the contact surfaces can produce a suitable bond. Heating from one direction and cooling from another side can be used to locally heat to a small area near the contact surfaces. Small amounts of material or thin sheets of material in a perform cut to die or strip size to match the thermoelectric component parts.

Materials in thin sheets or thin film form are used, according to embodiments of the present invention, to provide for a buffer that protects the thermoelectric superlattice materials during the friction bonding. Materials in thin sheets avoid mechanical damage to the top layers of the thermoelectric materials. The thin layer is selected to form a eutectic that allows friction bonding. In friction bonding, the surfaces of the materials to be bonded can be roughened if necessary to improve the friction and thus the efficacy of forming a friction bond.

Further, diffusion bonding or thermal annealing can be used to bond the thermoelectric devices to a semiconductor device chip. Bonding can occur between a top header of a thermoelectric devices and a semiconductor device chip by any number of the processes described herein, and can utilize a bonding material to facilitate coupling of the semiconductor device chip to the semiconductor device chip. Regardless of approach, a thermally conductive and mechanically stable connection or bond is preferred between the top header and the semiconductor device chip. Bonding to the semiconductor device chip to the thermoelectric devices according to embodiments of the present invention can be accomplished in the following non-limiting examples by:

1. utilization of thermal adhesives or thermally conductive epoxy,
2. soldering,
3. diffusion bonding using electroplated or evaporated metal contacts,
4. utilization of anisotropic thermal adhesives,
5. utilization of thermoplastic conductive polymers, and
6. utilization of silicon to silicon molecular bonding (in the case where the cooling header of the thermoelectric device is made from silicon).

Heat flux from the semiconductor device chip can be dissipated from the thermoelectric devices according to embodiments of the present invention by a heat sink operating at a temperature above that of the semiconductor device chip. Moreover, once bonded, the attached thermoelectric devices according to embodiments of the present invention, when not cooling, can sense a heat flux from the chip and thus can provide active sensing of the device chip performance. A template of such thermoelectric devices can therefore, in one embodiment of the present invention, provide a mapping of device component utilization (i.e., those device components having higher utilizations will produce higher amounts of heat flux into the proximate thermoelectric devices).

Thus, as illustrated above, embodiments the present invention can utilize a number of approaches using bonding to facilitate thermal transfer by thermal conduction from one thermoelectric power conversion stage to another. Such techniques and other techniques known in the art can be used to appropriately bond the various stages together. These approaches, according to embodiments of the present invention, may realize high-quality thermal interfacing.

Figure 9:
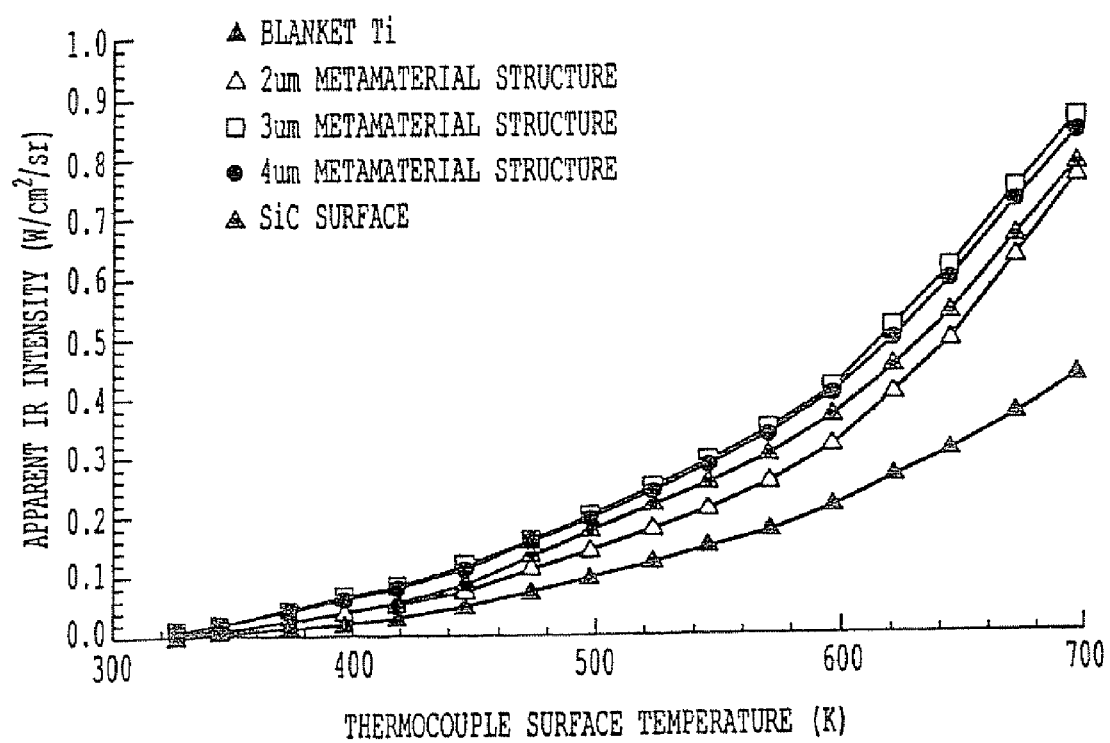
FIG. 9 is a plot of apparent emission intensity as a function of surface temperature of different engineered structures according to embodiments of the present invention.

Another alternative approach according to embodiments of the present invention for integrating the various thermoelectric conversion stages utilizes radiant thermal energy transfer using Purcell-enhancement cavity transmitter/receiver structures such as those described in the afore-mentioned U.S. Provisional Application No. 60/253,743, the entire contents of which are incorporated herein by reference, entitled "Spontaneous emission enhanced heat transport method and structures for cooling, sensing, and power generation" for heat transfer from one thermoelectric power conversion stage to another. In this approach, the radiant portion, if not the dominant. process, plays a substantial role in managing thermal stress by providing less-rigidly-bonded interfaces. FIG. 9 is a schematic illustration in which radiant coupling is used between adjacent thermoelectric conversion stages.

Figure 8:
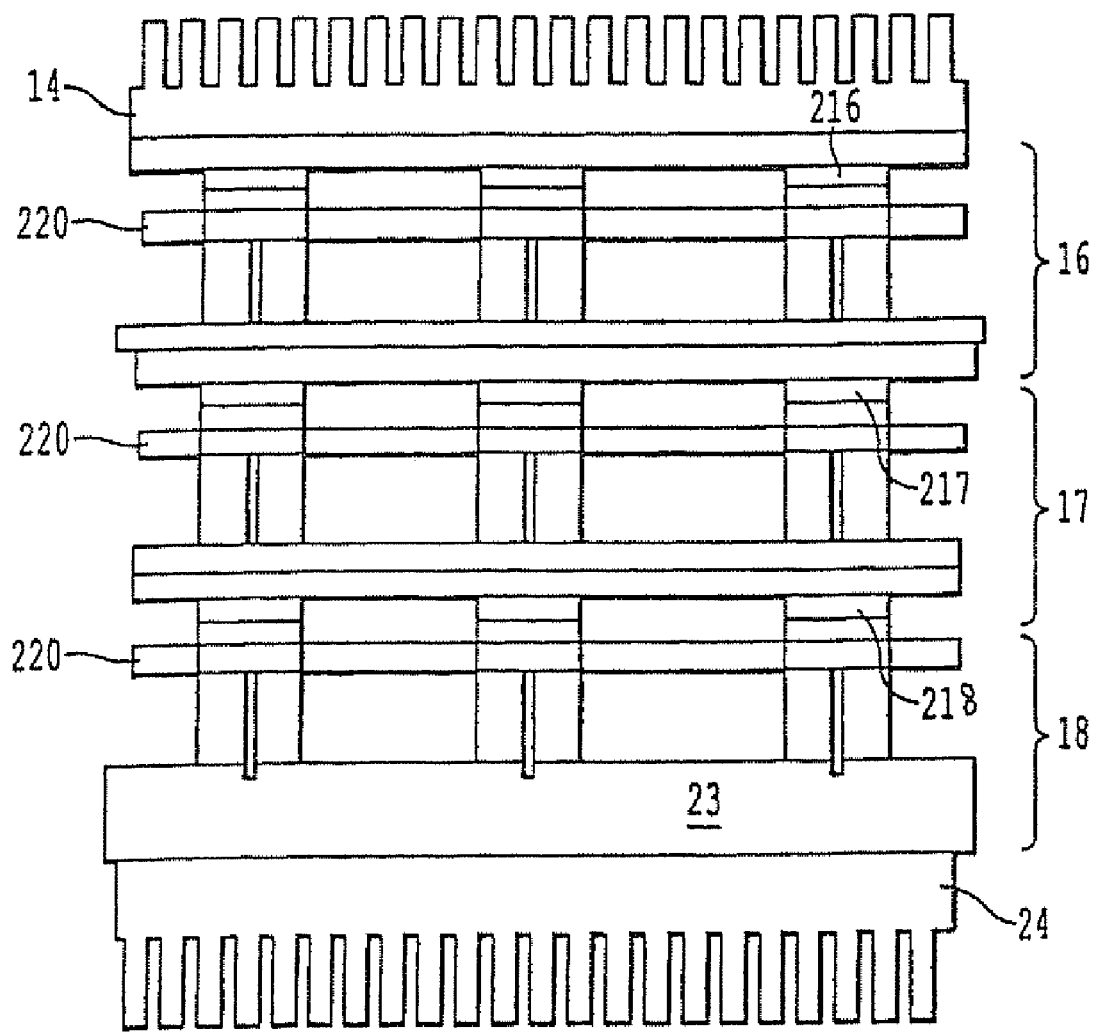
FIG. 8 is a schematic of a multi-stage thermoelectric device according to embodiments of the present invention employing resonant thermal energy transfer using Purcell-cavity enhancement effects and proximity-coupling of IR modes between various stages.

As shown in FIG. 8 a heat source 14 is coupled via radiant coupling mechanism 216 to a thermoelectric stage 16. Stage 16 is in turn coupled via radiant coupling mechanism 217 to the thermoelectric stage 17. Stage 17 is in turn coupled via radiant coupling mechanism 218 to the thermoelectric stage 18. Electrical connections 220 provide connections to the thermoelements on each stage.

Further, embodiments the present invention can utilize Purcell enhancement from an enhanced density of radiative modes in small-scale structures (similar to enhanced electronic density of states in quantum-confined systems) for enhanced spontaneous emission using patterned/, um-size-range, appropriately-spaced, structures for specific temperatures, on the heat spreader. Thus, engineered micro-fins can also potentially enhance spontaneous radiative heat transport. These micrometer-size geometries are achievable with photolithography and large-area wafers for a cost-effective implementation.

Spontaneous-emission enhanced heat transport (SEEHT) may additionally enhance emission at infra-red wavelengths near 300K. The incorporation of micron or sub-micron size Purcell cavities, will provide for the theoretical maximum radiative emission at peak wavelengths of 10 micrometers which will enhance heat transport by as much as a factor of 1000 at 300K, leading to a radiative dissipative flux of $\Phi_{SEEHT}$ of 44 W/cm$^2$.

Such micron size particles incorporated by impregnation or self-assembly, followed by overgrowth, permit the scope for radiative heat transfer mechanisms to be considerably enhanced. Such particles can further be incorporated in high-thermal conductivity heat spreader such as SiC, AlN, Si, diamond, etc. Enhancement of such intensities, even compared to highly-emissive (Ti) surfaces, showing both structure dependence and wavelength dependence, is shown in FIG. 9. Indeed, FIG. 9 is a plot of apparent emission intensity as a function of the surface temperature of different engineered structures according to embodiments of the present invention. As such, in one embodiment of the present invention, a radiative coupling mechanism includes a thermally conductive layer having dispersed therein particles including one of metal, semimetal, and semiconductor particles to thereby enhance black body radiation from the thermally conductive layer and support radiative heat transfer across the interfaces of the thermoelectric device components without the necessity of physical bonding.

While not limited to the following theory, embodiments the present invention may recognize that enhanced emission with these Purcell cavity structures can be further enhanced/realized if there is matching of "increased density of states" in emitters with "increased density of states" with receivers/absorbers, i.e., resonant thermal energy transfer. In addition to "resonant thermal energy transfer" by Purcell-cavity effects, other "proximity coupling of radiative infrared modes" can be exploited as well, according to embodiments of the present invention. Utilization of radiation coupling may, according to embodiments of the present invention, reduce thermal stress, by removing (strong) physical interfacial contacts between various stages. Further, the mechanical alignment of the resonant structures may not be a significant issue, given that the typical size of the inverted couple headers are about 300 μm×300 μm.

Thermoelectric Modules

For automatic assembly of the modules described above a dicer and pick-and-place tools (standard to the IC industry)

can be used. A wafer dicer and robotic pick-and-place tool, provide not only cost-effective but also reliable fabrication of both mini-modules and large-scale modules. The tool is used to dice p-n couple dies from a processed wafer and to assemble these inverted couple dies into a range of devices, from mini-modules to large-array of mini-modules. The dicer and pick-and-place tools, described above can also be used according to embodiments of the present invention to assemble thin-substrate (i.e., 100 µm to 250 µm thick) bulk modules as well as substrate die containing the afore-mentioned superlattice thin-film structures.

In one aspect according to embodiments of the present invention, large-scale headers are used, on which a large array of mini-modules are assembled to produce large-scale modules and proportionally larger powers.

Figure 10:
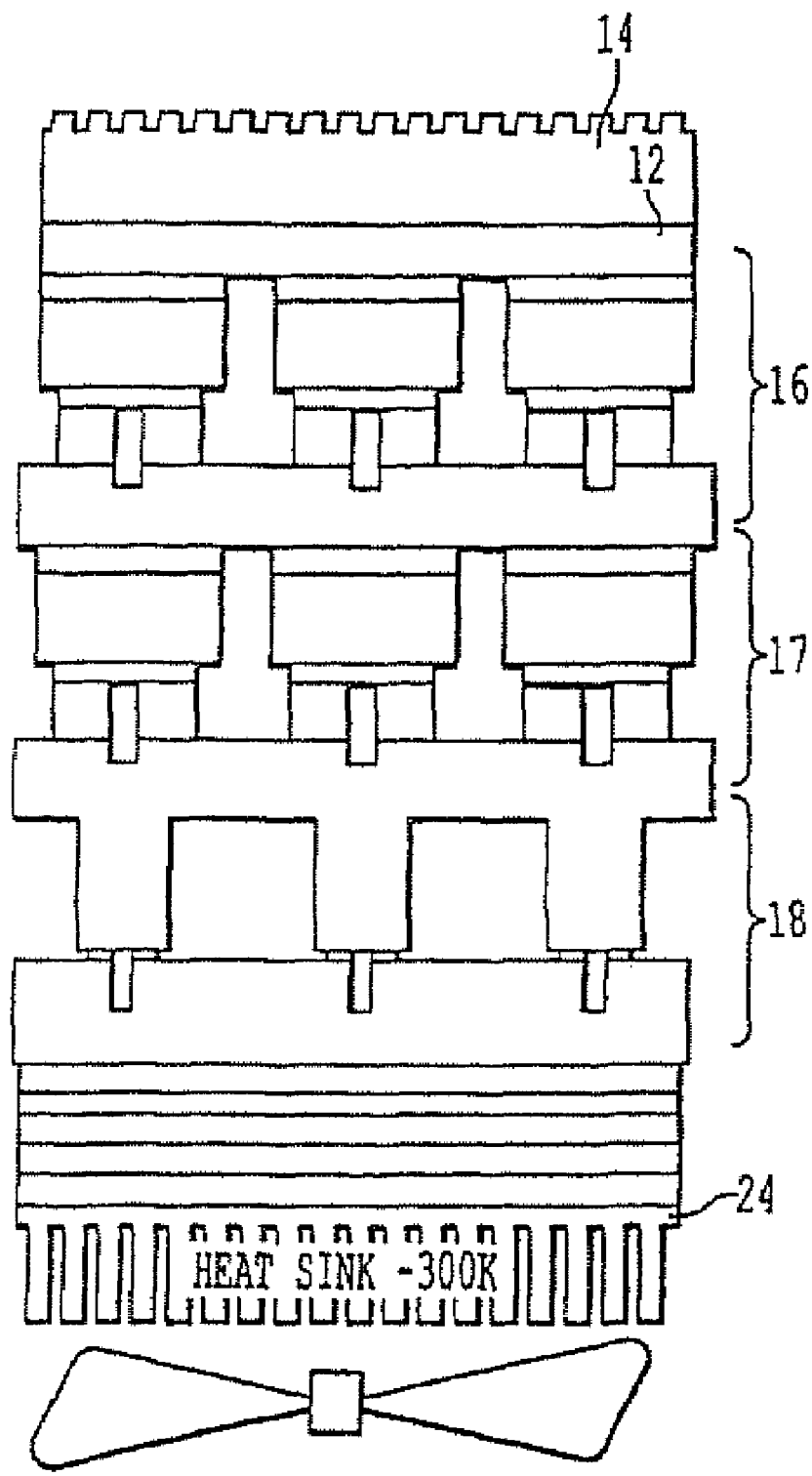
FIG. 10 is a schematic arrangement of a three stage thermoelectric device according to embodiments of the present invention with a split-header to provide thermal expansion relief.

FIG. 10 is a schematic arrangement of a three stage or unit thermoelectric device according to embodiments of the present invention having a split-header on a lower stage 18 to provide thermal expansion relief. In another aspect according to embodiments of the present invention, the lower-stage 18 of the multi-stage thermoelectric device can be nearly instantly converted to a heat pump for short periods of time, thus avoiding catastrophic device damage due to, for example, an interruption in coolant flow, and further enhancing reliability. As such, FIG. 10 represents a multi-stage thermoelectric device according to embodiments of the present invention in which electrical reconfiguration avoids catastrophic failures during coolant flow loss to the lower stage 18 and thus the risk of deterioration of the thermoelectric properties of the thermoelements at this stage (i.e., due to deterioration of the thermoelectric materials and/or contacts) may be reduced and/or minimized.

Figure 11:
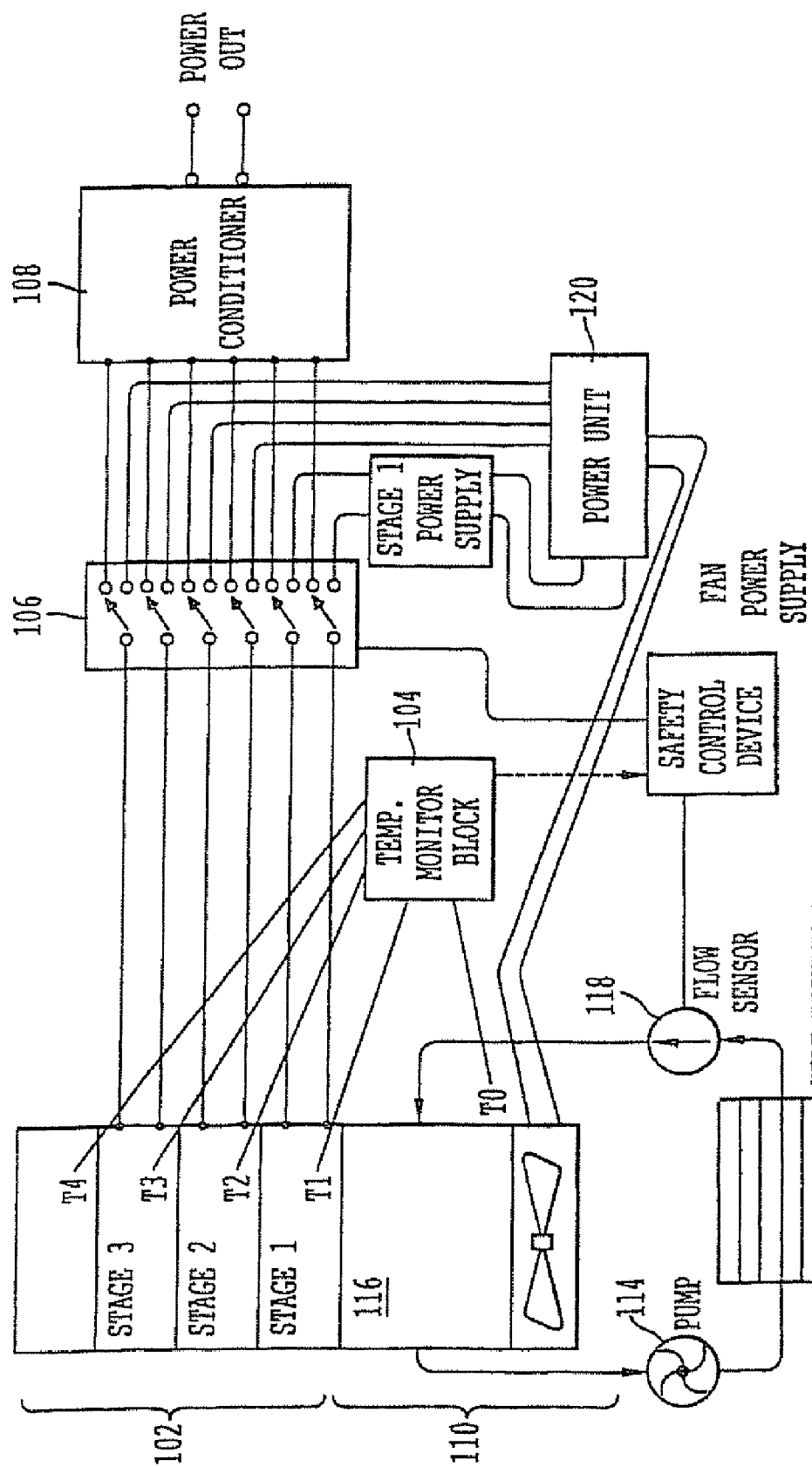
FIG. 11 is an electrical diagram showing a configuration for operating a thermoelectric device according to embodiments of the present invention in either a cooling mode or a heat pump mode.

An electrical configuration for permitting avoidance of a catastrophic failure is depicted in FIG. 11. FIG. 11 is an electrical diagram showing an exemplary configuration for operating a thermoelectric device according to embodiments of the present invention in either a heat pump mode or a power conversion mode. As shown in FIG. 11, each stage of a thermoelectric device 102 is temperature monitored by temperature monitor block 104.

Each stage is electrically controlled/sensed by a switch block 106 and a controller 108.

In a power conversion mode, the controller 108 supplies power out from the thermoelectric device 102. The controller can include filters and dc-ac converters to output ac power or can include dc-dc power converters to output higher voltage dc power than directly available from the thermoelectric device 102. FIG. 12 depicts a cooling system 110 which for illustrative purposes depicts a heat exchanger 112 utilized to pump with pump 114 a fluid to a heat sink plate 116. A flow sensor 118 monitors the flow of coolant to the heat sink plate 116. A temperature of the lower stage and the output power from the lower stage is monitored by a power unit 120. In the event of coolant failure, the controller 108 can electrically reconfigure the thermoelectric device from a power conversion mode to a heat pump mode. As a result, heat will be pumped to the heat source upon this electrical reconfiguration permitting the temperature of the lower stage devices to at least momentarily avoid overheating and catastrophic destruction. Once the coolant failure is restored, or in the event of permanent failure of the cooling system 110, the thermoelectric device can continue in the "cooling" mode until the heat source is turned off, removed, or otherwise decoupled from the thermoelectric device 102. As such, catastrophic failures can be reduced and/or avoided.

Further, the controller 108 being connected to the separate stages can switch the stages from the above-noted power conversion mode and heat pump (i.e., a cooling mode) to a heat flux sensing mode. In a heat sensing mode, the current through the thermoelements are measured as an indicator of the heat flux through the thermoelements coming from a heat source. Such information can be used as a measure of the heat being dissipated from the heat source. The controller can thus process a signal indicative of heat flux from the thermoelectric pair of n-type and p-type thermoelements.

Thus, the controller connected electrically to the thermoelectric devices according to embodiments of the present invention can be configured to switch the thermoelectric devices between at least one of a cooling mode, a heat pump mode, a power conversion mode, and a heat flux sensing mode.

Electronics Application

Accordingly, integration of thermoelectric devices and thermoelectric device modules to electronic devices such as semiconductor chip packages can be accomplished through a number of mechanisms according to embodiments of the present invention. Thermoelectric devices can be coupled to such devices for the purposes of "hot spot" cooling those parts of the device most susceptible to exceeding operational temperature limits.

Integrated semiconductor devices requiring hot spot cooling include, for example, microprocessors, graphic processors and other power dissipating devices fabricated in silicon, germanium, silicon-germanium, gallium arsenide, or any such semiconductor material. The integration can occur, for example, via recesses in the semiconductor chip and/or in the headers. In this approach, vertical and lateral vias or recesses are fabricated in the semiconductor chip and/or the heat spreader. The above-noted bonding techniques join the semiconductor chip to the heat spreader.

Figure 12A:
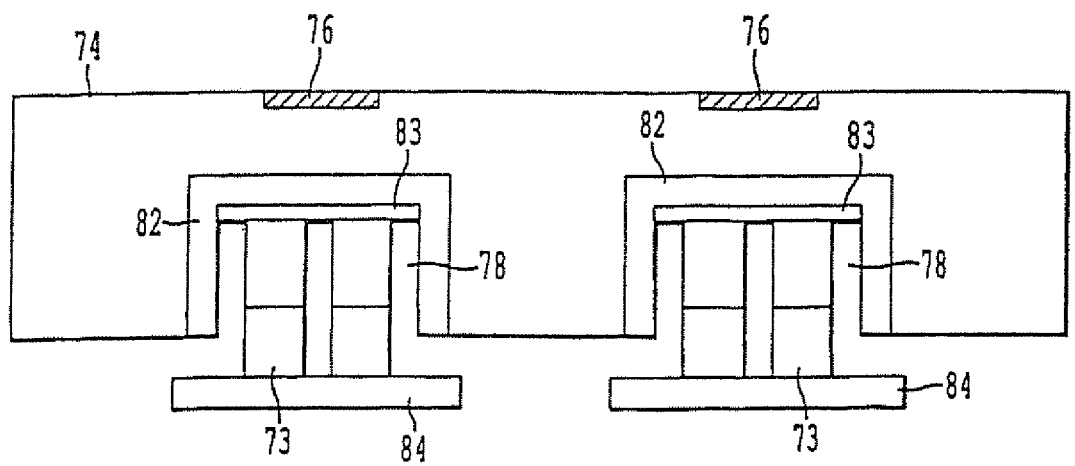
FIG. 12A is a schematic depicting a coupling structure used to couple a thermoelectric device to a semiconductor device chip.

FIG. 12A is a schematic depicting a coupling structure for coupling a thermoelectric device according to embodiments of the present invention to a semiconductor device chip.

Specifically, FIG. 12A depicts a thermoelectric device attached to a semiconductor device chip 74. The semiconductor device chip 74 includes the aforementioned power dissipating devices 76 in a region proximate to the recesses 78. Selective cooling occurs via the cooling of recesses 78 in the semiconductor device chip 74. The recesses 78 permit alignment of the thermoelectric devices 72 to the power dissipating devices 76.

Further, an electrically insulating interlayer 82 can be preferably interposed between the thermoelectric devices and the semiconductor material of the chip. As noted previously, the properties of the electrically insulating interlayer 82 are such to permit electrical isolation without impeding heat flux between the semiconductor device chip 74 and the thermoelectric devices. An electrically insulating material such as $SiO_2$ can be suitable for the electrically insulating interlayer 82, although other insulating materials known in the art are likewise applicable. The electrically insulating interlayer 82 is at least applied to the semiconductor chip in regions where the thermoelectric devices are to be attached. Following application, metallized contacts 83 can be made on the electrically insulating interlayer 82 to provide electrical connections to the thermoelectric devices. Metallized contacts can be made using one or more of known metallization techniques such as, for example, but not limited to evaporation, electroplating, or soldering. Following metallization, diffusion bonding, or thermal annealing can be used to bond the thermoelectric devices to the chip.

Bonding occurs between a top header 79 of the thermoelectric devices and the semiconductor device chip 74 by any number of the processes described above, and can utilize a bonding material 80 to facilitate coupling of the semiconductor device chip 74 to the semiconductor device chip 74. Regardless of approach, a thermally conductive and mechanically stable connection or bond is preferred between the top header 79 and the semiconductor device chip 74.

Heat flux from the semiconductor device chip 74 is dissipated from the thermoelectric devices 72 by a heat sink operating at a temperature above that of the semiconductor device chip 74. As such, heat flux from the power dissipating devices 76 is more efficiently dissipated to the outside environment due to the higher temperature differential existing between the temperature of the heat sink and the ambient than the temperature of the semiconductor device chip 74 and the ambient.

Figure 12B:
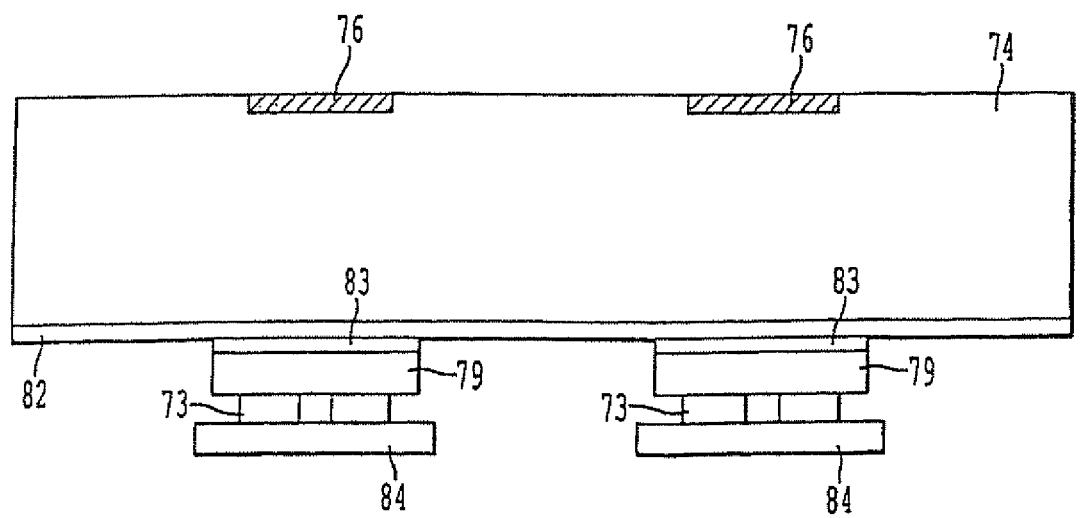
FIG. 12B is a schematic depicting another coupling structure used to couple a thermoelectric device to a semiconductor device chip.

FIG. 12B is a schematic depicting another coupling structure for coupling a thermoelectric device to a semiconductor device chip. As shown in FIG. 8B, the thermoelectric devices 72 can be directly attached to the semiconductor device chip 74 without utilization of recesses 78. In this coupling structure, placement of the thermoelectric devices 72 on the semiconductor device chip 74 aligns the thermoelectric devices 72 opposite the power dissipating devices 76.

Figure 13:
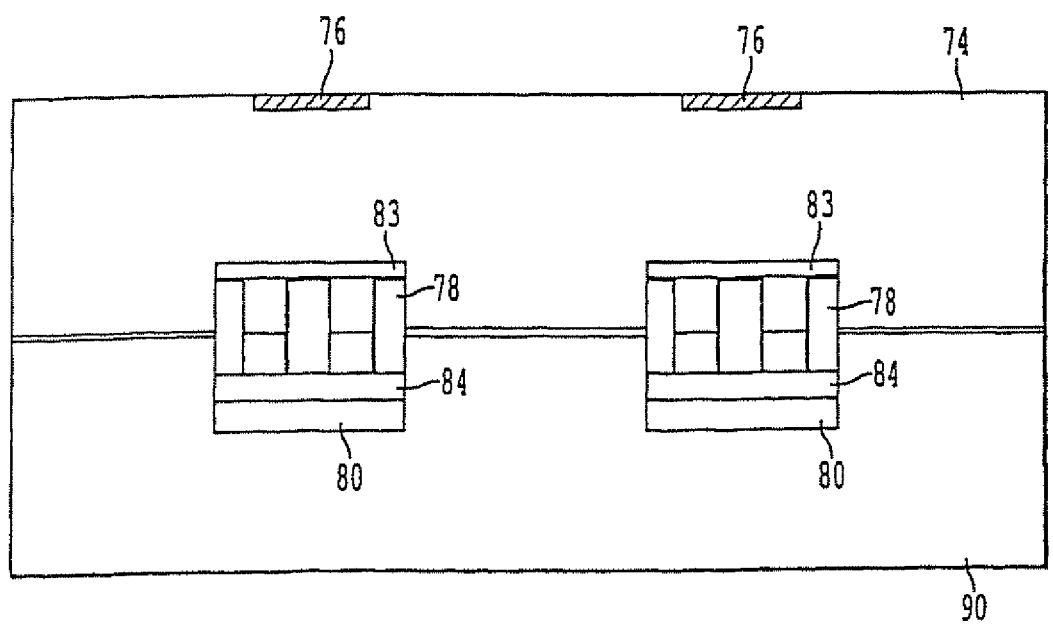
FIG. 13 is a schematic depicting another coupling structure used to couple a thermoelectric device to a semiconductor device chip.

Thus, coupling of thermoelectric devices 72 to the semiconductor device chip 74 occurs with or without the utilization of recesses. FIG. 13 is a schematic depicting another coupling structure for coupling a thermoelectric device to a semiconductor device chip. As shown in FIG. 13, thermoelectric devices 72 are attached in recesses 78 existing in both the semiconductor device chip 74 and a heat spreader plate 90. The heat spreader plate 90 can utilize a bonding material 80 to couple the heat spreaders 84 to the heat spreader plate 90.

Figure 14A:
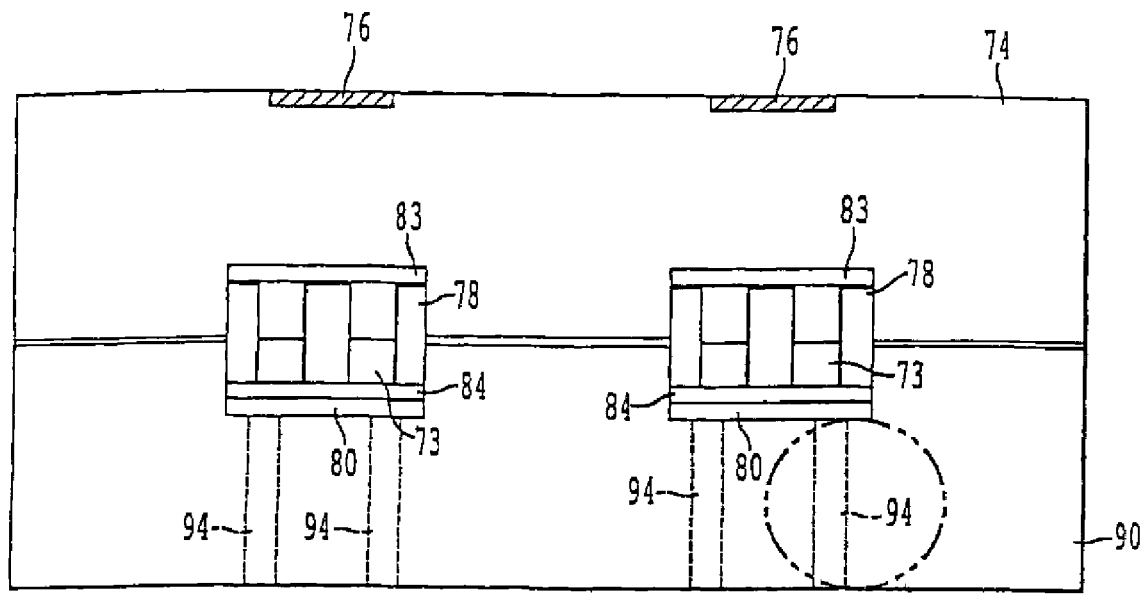
FIGS. 14A and 14B schematically depict a coupling structure including vias used to provide electrical connections to thermoelectric devices.
Figure 14B:
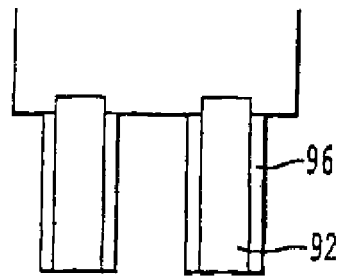

FIGS. 14A and 14B schematically depict another coupling structure for coupling thermoelectric devices to a semiconductor device chip. The coupling structure includes vias for electrical connections to the thermoelectric devices. Power requirements for the thermoelectric devices require that electrical leads to the thermoelectric devices be electrically insulated. As shown in FIGS. 14A and 14B, the electrical leads 92 can be integrated directly in a header (e.g., header plate 90) by vias 94, which either vertically or laterally provide electrically conductive channels. The vias 94 can be either etched or pre-fabricated such that the vias 94 run through the header plate 90. Insulating material 96 for the vias 94 can be any high temperature plastic or ceramic of sufficient dielectric quality which encapsulates metal (e.g., copper, gold or, any high electrically conductive metal). Vias in the header plate 90 can be created by laser ablation and can have electroplated metal deposited therein. This structure shown in FIGS. 14A and 14B having insulated electrical leads facilitates independently power or sensing of individual ones of the thermoelectric devices. The header plate 90 would be made of materials that match the coefficient of thermal expansion of silicon (e.g., within a 5% match in terms of linear expansion coefficient).

Figure 15:
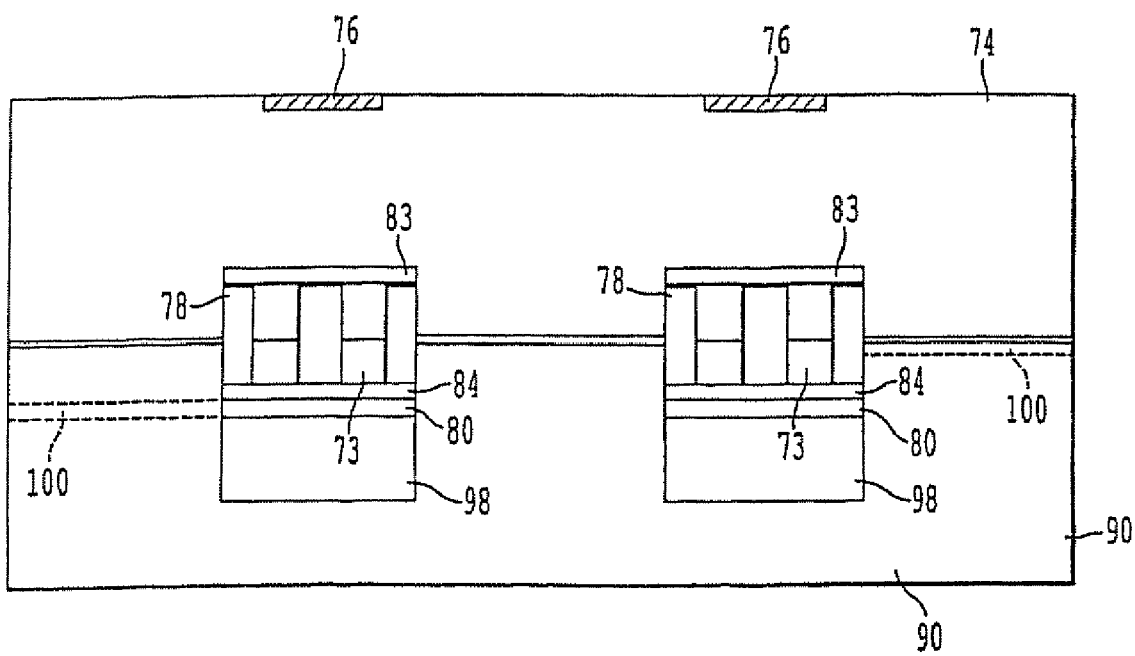
FIG. 15 is a schematic depicting a coupling structure including high thermal conductivity materials in a heat sink plate.

FIG. 15 is a schematic depicting another coupling structure for coupling thermoelectric devices to a semiconductor device chip. The coupling structure includes vias for electrical connections to the thermoelectric devices and includes high thermal conductivity materials in the header plate 90. A combination of high thermal conductive materials 98 like highly oriented pyrolytic graphite, carbon foams, graphite foams can be used to enhance the rejection of heat from the hot side of the thermoelectric device. These materials can be used as a part or for the entirety of the heat spreader plate 90. Thermal conductivity of these materials can be five times that of the thermal conductivity of copper. These materials would be extremely efficient in dissipating heat from the heat sink 84 of the thermoelectric devices 72. As illustrated in FIG. 15, lateral electrical connections 100 connect to the thermoelectric devices 72.

The lateral electrical connections 100 like the electrical leads 92 are formed with electrically conductive materials and insulated from the heat sink plate 90.

Solar Power Conversion

According to embodiments of the present invention, thermoelectric elements may be used to provide a thermoelectric generator to convert solar energy into electrical energy. More particularly, a relatively low density of thermoelectric elements may be thermally coupled between a first thermally conductive plate acting as a solar collector and a second thermally conductive plate acting as a heat sink. By using a relatively low density of thermoelectric elements (i.e., a relatively low packing fraction of thermoelectric elements), a heat flux through the thermoelectric elements may be increased thereby increasing an efficiency of operation of the thermoelectric elements. A relatively low density of thermoelectric elements may also reduce a cross-sectional area of semiconductor-material used for the thermoelectric generator (as compared to a cross-sectional area of semiconductor material used in a photovoltaic cell) thereby reducing a cost of the thermoelectric generator and reducing a cost of converting solar energy into electrical energy.

Figure 16:
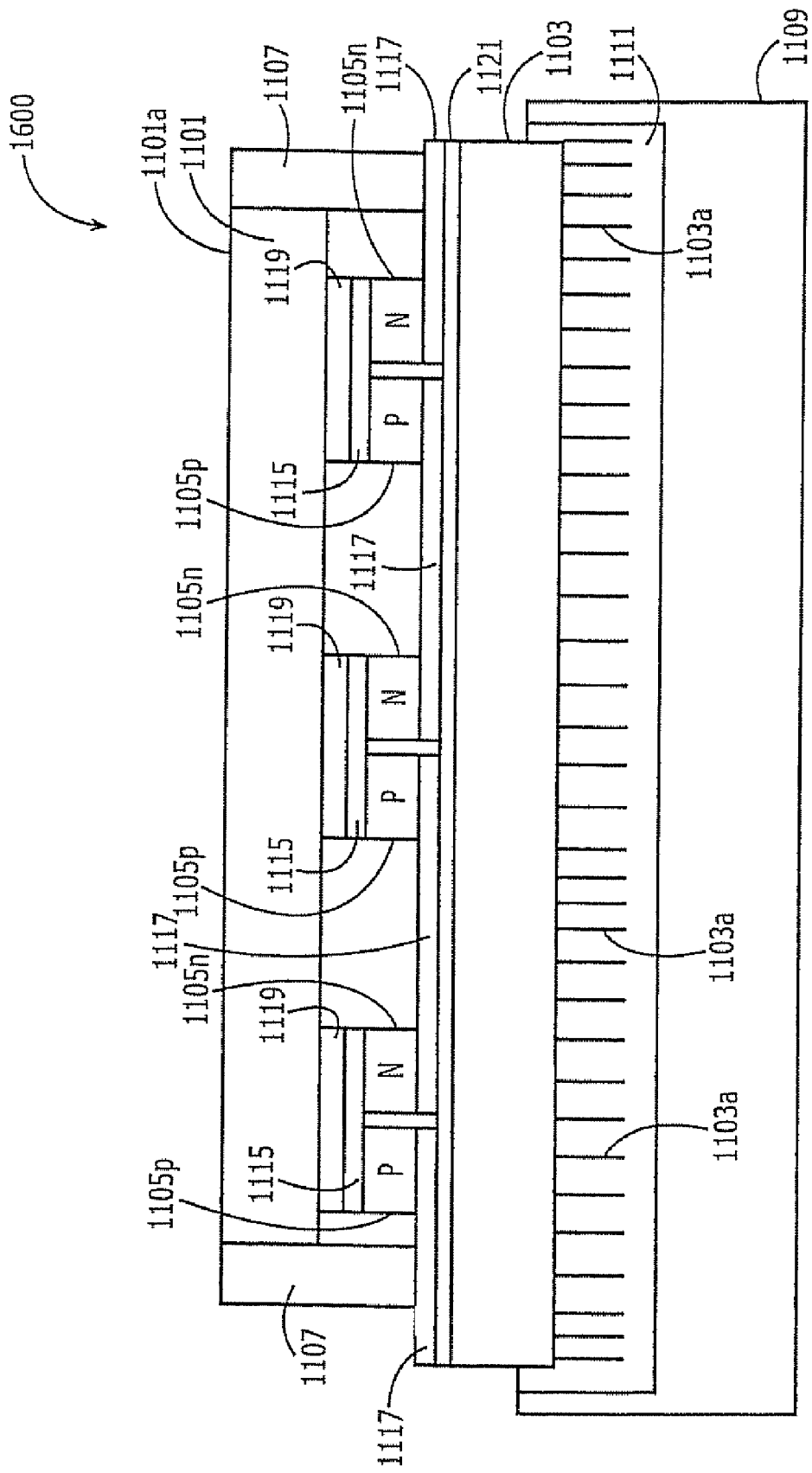
FIG. 16 is a cross-sectional view of a thermoelectric generator according to more embodiments of the present invention.

As shown in the cross-sectional view of FIG. 16, a thermoelectric generator 1600 according to some embodiments of the present invention may include a first thermally conductive plate 1101, a second thermally conductive plate 1103, and a plurality of P-type thermoelectric elements 1105$p$ and N-type thermoelectric elements 1105$n$ arranged in pairs (also referred to as thermoelectric couples). As shown, the P-type and N-type thermoelectric elements 1105$p$ and 1105$n$ are provided in a space between the first and second thermally conductive plates 1101 and 1103, and the space between the plates 1101 and 1103 may be environmentally sealed by a sealant 1107, for example, using a relatively low thermal conductivity compliant material. In addition, a vacuum (e.g., on the order of about 1 Torr or less) may be maintained in the space between the plates 1101 and 1103 to both protect the thermoelectric elements and to reduce thermal conduction between the first and second plates 1101 and 1103 in regions between thermoelectric elements. In addition or in an alternative, the space between the plates 1101 and 1103 may be filled with a relatively low thermally conductivity gas such as Ar, and the relatively low conductivity gas may be provided at a relatively low pressure/vacuum (e.g., on the order of about 1 Torr or less). The first and second thermally conductive plates 1101 and 1103 may be substantially flat (i.e., planar) to provide integration with flat-panel solar collectors.

The first thermally conductive plate 1101 may be configured to generate heat responsive to solar radiation. More particularly, the first thermally conductive plate 1011 may be configured to generate heat responsive to solar radiation incident thereon. For example, the first thermally conductive plate 1101 may have an optically dark surface 1101$a$ facing away from the thermoelectric elements 1105$p$ and 1105$n$ to enhance absorption of solar energy incident thereon. The first thermally conductive plate 1101, for example, may be a metal plate having a blackened and/or painted surface to provide the optically dark surface 1101$a$. In addition or in an alternative, the first thermally conductive plate 1011 may be configured to generate heat responsive to a heat transfer liquid such as water from a solar collector to obtain temperature differentials on the order of about 50 K to about 80 K (with steam not being allowed to form in some embodiments). Moreover, a heat spreader and/or other heat transfer mechanism may be used to channel heat from a point of collection of solar energy to the thermally conductive plate 1101 so that a line of sight between the sun and the first thermally conductive plate 1101 may not be required.

The second thermally conductive plate 1103 may be configured to provide thermal coupling to a thermal sink. In addition or in an alternative, the first thermally conductive plate 1101 may be configured to emit radiation, and the second thermally conductive plate 1103 may be configured to provide thermal coupling to a thermal source. In either case, the second conductive plate 1103 may provide a thermal coupling to a relatively large thermal mass 1109 having a relatively constant temperature, such as a relatively large mass of subterranean soil, water, and/or rock, having a relatively constant temperature of about 60 degrees F. Thermal coupling between the second thermally conductive plate 1103 and the thermal mass may be provided, for example, using fins 1103a of the second thermally conductive plate 1103 and/or a relatively high thermal conductivity and compliant material 1111, such as a thermally conductive grease.

As shown in FIG. 16, each of the P-type and N-type thermoelectric elements 1105$p$ and 1105$n$ are thermally coupled in parallel between the first and second thermally conductive plates 1101 and 1103. Moreover, the P-type thermoelectric element 1105$p$ and the N-type thermoelectric element 1105$n$ of a pair (or couple) are electrically coupled in series so that a direction of current flow through the P-type thermoelectric elements 1105$p$ is opposite a direction of current flow through the N-type thermoelectric elements 1105$n$. More particularly, conductive traces 1115 on the first plate 1101 may provide electrical coupling between P-type and N-type thermoelectric elements 1105$p$ and 1105$n$ of respective pairs (or couples), and conductive traces 1117 on the second plate 1103 may provide electrical coupling between pairs of thermoelectric elements. In addition, electrically insulating and thermally conducting layers 1119 and/or 1121 (such as $SiO_2$, SiN, SiON, etc.) may provide electrical isolation for the conductive traces 1115 and/or 11 7 if the first plate 1101 and/or second plate 1103 is an electrically conducting material (such as a metal, conductive semiconductor material, etc.). The electrically insulating and thermally conducting layers 1119 may be omitted if the first plate 1101 is electrically insulting, and/or the electrically insulating and thermally conducting layers 1121 may be omitted if the second plate 1103 is electrically insulting. Examples of electrically insulating and thermally conducting materials that may be used for the first and/or second plates 1101 and/or 1103 include AlN, SiC, and/or diamond.

By providing the thermal and electrical interconnections of the thermoelectric elements 1105$p$ and 1105$n$ as shown in FIG. 16, a temperature differential between the first and second thermally conductive plates 1101 and 1103 may be used to generate an electrical current through the thermoelectric elements 105$p$ and 105$n$ and the electrically conductive traces 1115 and 1117 according to the Peltier effect. The Peltier effect is discussed, for example, in the reference by Venkatasubramanian et al. entitled *"Phonon-Blocking Electron-Transmitting Structures"* (18$^{th}$ International Conference On Thermoelectrics, pages 100-103, 1999), and in U.S. Patent Publication No. 2003/0099279, the disclosures of which are hereby incorporated herein in their entirety by reference. Power generation using the Peltier effect is discussed, for example, in International Publication No. WO 2005/074463 and in International Publication No. WO/2002/045150, the disclosures of which are hereby incorporated herein in their entirety by reference.

According to some embodiments of the present invention, the P-type and N-type thermoelectric elements 1105$p$ and 1105$n$ may respectively include P-type and N-type $Bi_2Te_3$ thermoelectric material. More particularly, each of the P-type and N-type $Bi_2Te_3$ thermoelectric elements may include a superlattice of $Bi_2Te_3$ and $Sb_2Te_3$ formed using epitaxial deposition on a substantially single crystal substrate so that each thermoelectric element includes a substantially single crystal supperlattice of alternating $Bi_2Te_3$ and $Sb_2Te_3$ layers. Superlattices of $Bi_2Te_3$ and $Sb_2Te_3$ are discussed, for example, in the reference by Venkatasubramanian et al. entitled *"Phonon-Blocking Electron-Transmitting Structures"* (18$^{th}$ International Conference On Thermoelectrics, pages 100-103, 1999), and in U.S. Patent Publication No. 2003/0099279, the disclosures of which are hereby incorporated herein in their entirety by reference.

By way of example, the plurality of P-type thermoelectric elements 1105$p$ may be formed by growing a P-type thermoelectric epitaxial layer(s) on one or more single crystal growth substrates, dicing the growth substrate(s) with the P-type epitaxial layer thereon, and separating the diced P-type thermoelectric elements 1105$p$ from the growth substrate (using a selective chemical etch). Similarly, the plurality of N-type thermoelectric elements 1105$n$ may be formed by growing an N-type thermoelectric epitaxial layer(s) on one or more single crystal growth substrates, dicing the growth substrate(s) with the N-type epitaxial layer thereon, and separating the diced N-type thermoelectric elements 1105$p$ from the growth substrate (using a selective chemical etch).

Moreover, the conductive traces 1115 and/or 1117 may be provided using a metal such as copper and/or aluminum, and solder bonds may be used to provide electrical and mechanical coupling between the thermoelectric elements 1105$p$ and/or or 1105$n$ and the respective conductive traces 1115 and/or 1117. In addition, an adhesion layer (such as a layer including titanium, chromium, and/or tungsten) and/or a barrier layer (such as a layer including gold and/or nickel) may be provided between a thermoelectric element and a solder bond. Similarly, an adhesion layer (such as a layer including titanium, chromium, and/or tungsten) and/or a barrier layer (such as a layer including gold and or nickel) may be provided between a conductive trace and a solder bond. Formation of thermoelectric elements and interconnections thereof are discussed, for example, in U.S. Pat. No. 6,300,150, the disclosure of which is hereby incorporated herein in its entirety by reference.

As shown in FIG. 16, the pairs of P-type and N-type thermoelectric elements 1105$p$ and 1105$n$ may be spaced apart to increase a heat flux through the thermoelectric elements. By increasing a heat flux through the thermoelectric elements, an efficiency of operation of the thermoelectric elements may be increased. In addition of surface area of electronic grade semiconductor material may be reduced thereby reducing a cost of thermoelectric generators according to embodiments of the present invention. More particularly, a combined surface area of the P-type and N-type thermoelectric elements 1105$p$ and 1105$n$ in a plane perpendicular to a direction of heat flow between the first and second thermally conductive plates (also referred to above as a packing fraction of thermoelements) may be less than about 50% of a surface area of the first thermally conductive plate 1101, and more particularly, less than about 20%. Stated in other words, a surface area of the first thermally conductive plate 1101 may be at least 2 times or even 5 times greater than a combined surface area of P-type and N-type thermoelectric elements 1105*p* and 1105*n* coupled between the first and second thermally conductive plates 1101 and 1103. Still more particularly, a combined surface area of the P-type and N-type thermoelectric elements in a plane perpendicular to a direction of heat flow between the first and second thermally conductive plates (packing fraction) may be less than about 10% of a surface area of the first thermally conductive plate. Yet more particularly, a combined surface area of the P-type and N-type thermoelectric elements 1105*p* and 1105*n* in a plane perpendicular to a direction of heat flow between the first and second thermally conductive plates (packing fraction) may be less than about 1% or even less than about 0.5%.

Moreover, the P-type and N-type thermoelectric elements 1105*p* and 1105*n* may include P-type and N-type $Bi_2Te_3$ thermoelectric elements, and more particularly, may include substantially single crystal superlattices of $Bi_2Te_3$ and $Sb_2Te_3$. In addition or in alternatives, the P-type and/or N-type thermoelectric elements 1105*p* and/or 1105*n* may include thermoelectric materials such as $Bi_2Te_3$, $Sb_2Te_3$, superlattices of $Bi_2Te_3/Sb_2Te_3$, PbTe, PbSe, superlattices of PbTe/PbSe, Si, Ge, superlattices of Si/Ge, $Bi_2Te_{3-x}Se_x$, superlattices of $Bi_2Te_3/BI_2Te_{3-x}Se_x$, ZnSb, CdSb, superlattices of ZnSb/CdSb, InAs, InSb, superlattices of InAs/InSb, CdTe, HgCdTe, superlattices of CdTe/HgCdTe, $Ga_xIn_{1-x}As$, Ga.sub.yIn$_{1-y}$As, superlattices of $Ga_xIn_{1-x}As$/Ga.sub.yIn$_{1-y}$As, $(AgSbTe_2)_{1-x}(GeTe)_x$ also referred to as TAGS, PbTe-based quantum dot superlattices (QDSL), and/or combinations thereof.

Figure 17:
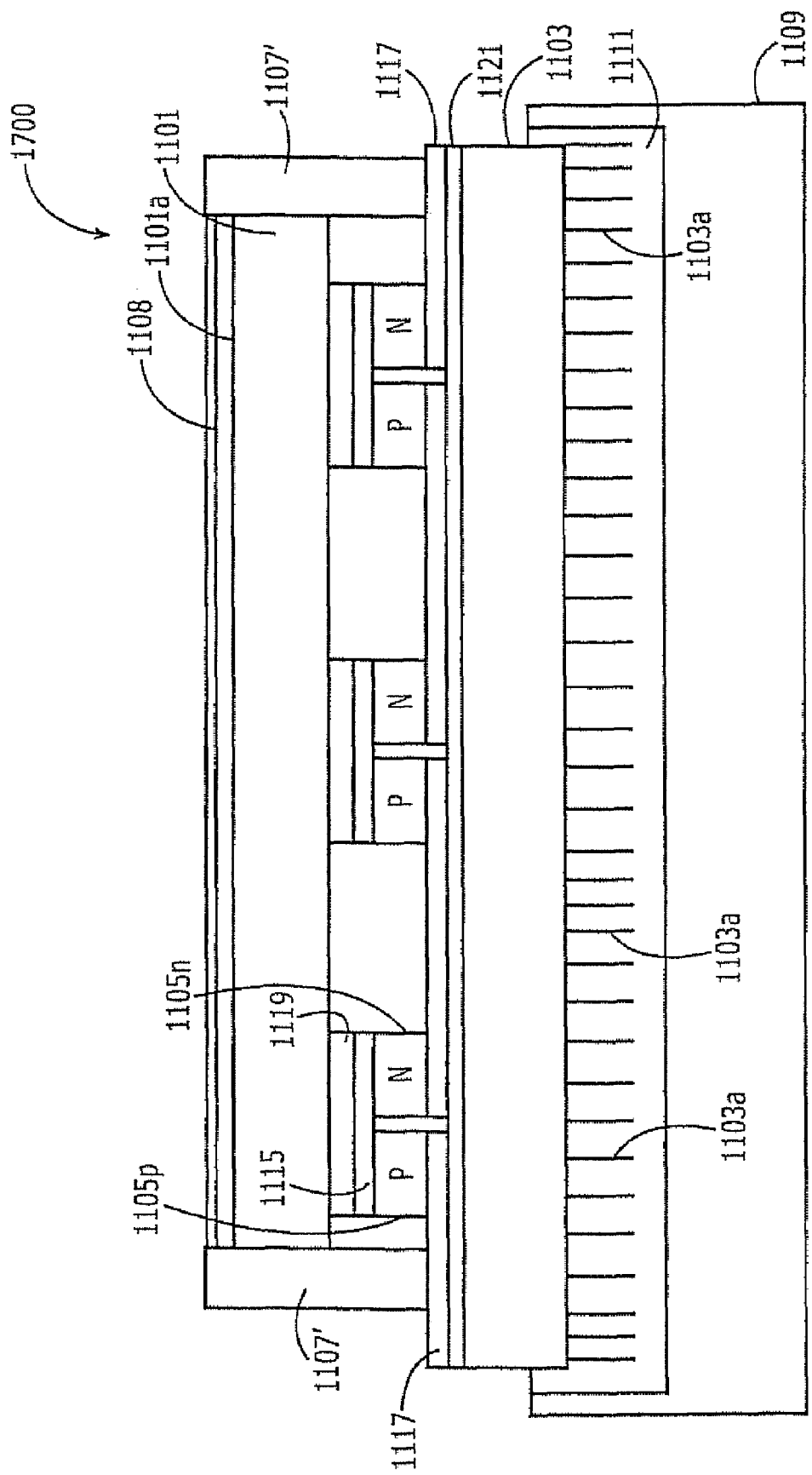
FIG. 17 is a cross-sectional view of a thermoelectric generator according to some more embodiments of the present invention.

As shown in the cross-sectional view of FIG. 17, a thermoelectric generator 1700 according to some more embodiments of the present invention may include a transparent cover 1108 in addition to the elements discussed above with regard to FIG. 16 together with a modified sealant 1107'. In particular, the sealant 1107' may be configured to maintain the transparent cover 1108 in a spaced apart relationship with respect to the thermally conductive plate 1101, and to maintain a relatively low pressure or vacuum (for example, about 1 Torr or less) in the space between the thermally conductive plate 1101 and the transparent cover 1108. In other words, the thermally conductive plate 1101 may be substantially isolated from an external environment, such as the atmosphere. Moreover, the transparent cover 1108 may be transparent with respect to solar radiation (or portions thereof) incident on the surface 1101*a* of the thermally conductive plate 1101. The transparent cover 1108 may also be transparent with respect to heat radiated from the thermally conductive plate 1101 to enhance radiative cooling during night time operations. The other elements of the thermoelectric generator 1700 may be the same as those discussed above with regarding to FIG. 16 so that further discussion thereof is not required.

During daylight, the thermoelectric generator 1700 may operate as discussed above with regard to the thermoelectric generator 1600 of FIG. 16. In particular, solar radiation may pass through the transparent cover 1108 to heat the thermally conductive plate 1101 thereby creating a temperature differential between the first thermally conductive plate 1101 (heated by solar radiation) and the second thermally conductive plate 1103 that is thermally coupled to the temperature stable (and relatively cool, for example, about 60 degrees F.) thermal mass 1109, such as subterranean water, soil, and/or rock. The temperature differential across the P-type and N-type thermoelectric elements 1105*p* and 1105*n* can thus generate an electric current according to the Peltier effect. By isolating the thermally conductive plate 1101 from a relatively cold atmosphere (i.e., colder than the plate 1101) loss of heat to the atmosphere may be reduced during daylight operation.

At night, the transparent cover 1108 may provide thermal isolation of the thermally conductive plate 1101 relative to the atmosphere to thereby enhance radiation of heat from the thermally conductive plate 1101 to outer space. Accordingly, the thermally conductive plate 1101 may radiate heat to outer space at night to provide a reversed temperature differential such that a temperature of the plate 1101 is less than a temperature of the plate 1103 that is thermally coupled to the temperature stable (and relatively cool, for example, about 60 degrees F.) thermal mass 1109. The reversed temperature differential across the P-type and N-type thermoelectric elements 1105*p* and 1105*n* may thus generate a reversed electric current according to the Peltier effect. Accordingly, the thermoelectric generator 1700 may provide both daytime and nighttime operations.

Figure 18:
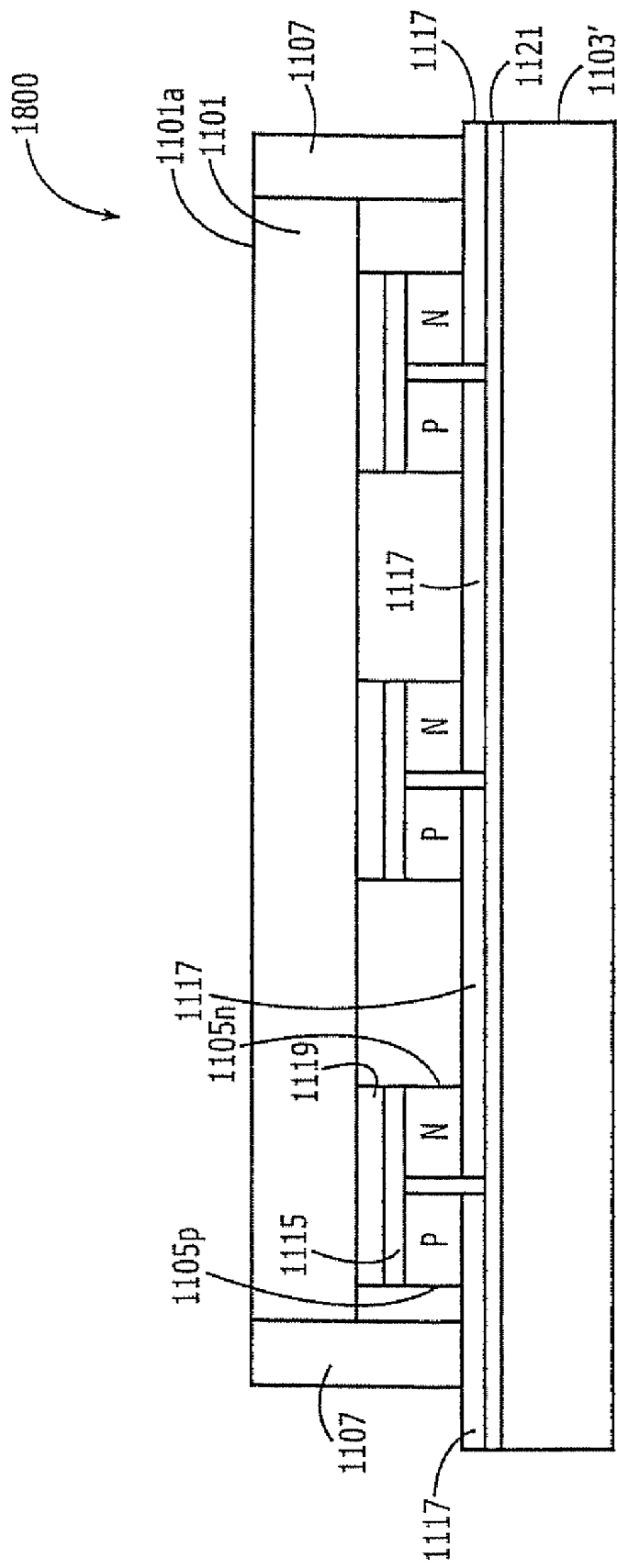
FIG. 18 is a cross-sectional view of a thermoelectric generator according to still more embodiments of the present invention.

As shown in the cross-sectional view of FIG. 18, a thermoelectric generator 1800 according to some more embodiments of the present invention may include a second thermally conductive plate 1103' configured to radiate heat into the vacuum of outer space (away from the sun). The other elements of the thermoelectric generator 1800 may be the same as those discussed above with regarding to FIG. 16 so that further discussion thereof is not required. Because heat is radiated into the vacuum of space, the thermally conductive and compliant material 1111 and the thermal mass 1109 may be omitted.

The thermoelectric generator 1800 may be configured for use in the vacuum of outer space, for example, with a satellite, space shuttle, space station, or other space based application. By orienting the first thermally conductive plate 1101 toward the sun and the second thermally conductive plate 1103 away from the sun (both in the vacuum of outer space), a temperature differential between the two plates may be provided. More particularly, solar radiation incident on the first plate 1101 may heat the first plate 1101 while radiative cooling may cool the second plate 1103, and the resulting temperature differential across the P-type and N-type thermoelectric elements may generate an electric current.

In each of the embodiments discussed above with respect to FIGS. 16-18, the P-N thermoelectric couples may be electrically connected to a load, for example, to either drive an electric device/circuit and/or charge a battery. For example, the P-N thermoelectric couples may be coupled to a charging circuit used to charge a battery. Moreover, all of the P-N thermoelectric couples between the first and second thermally conductive plates may be electrically coupled in one series chain. In an alternative, P-N thermoelectric couples of respective groups may be electrically connected in series with the groups being electrically coupled in parallel.

Figure 19:
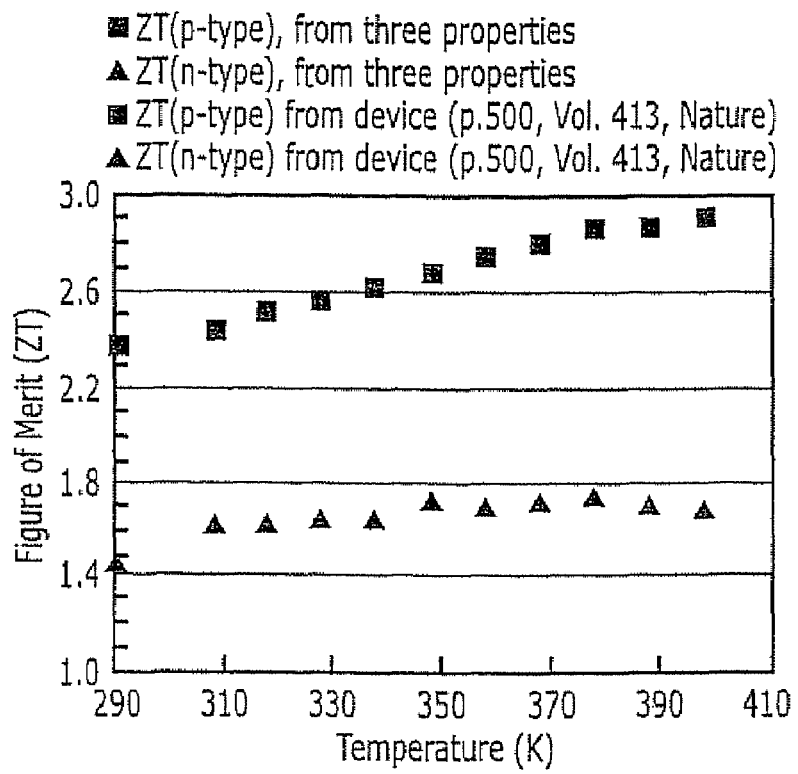
FIG. 19 is a graph illustrating thermoelectric figures of merit (ZT) as a function of temperature (in degrees K).
Figure 20:
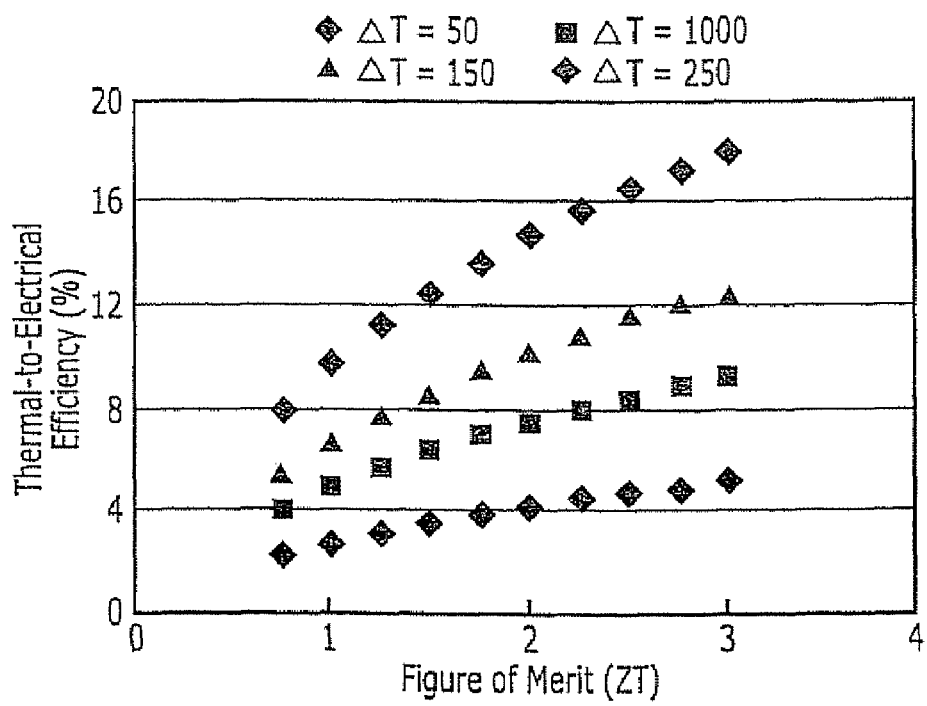
FIGS. 20 and 21 are graphs illustrating thermal-to-electric conversion efficiency (%) as a function of figures of merit (ZT) at different temperature differentials (ΔT).
Figure 21:
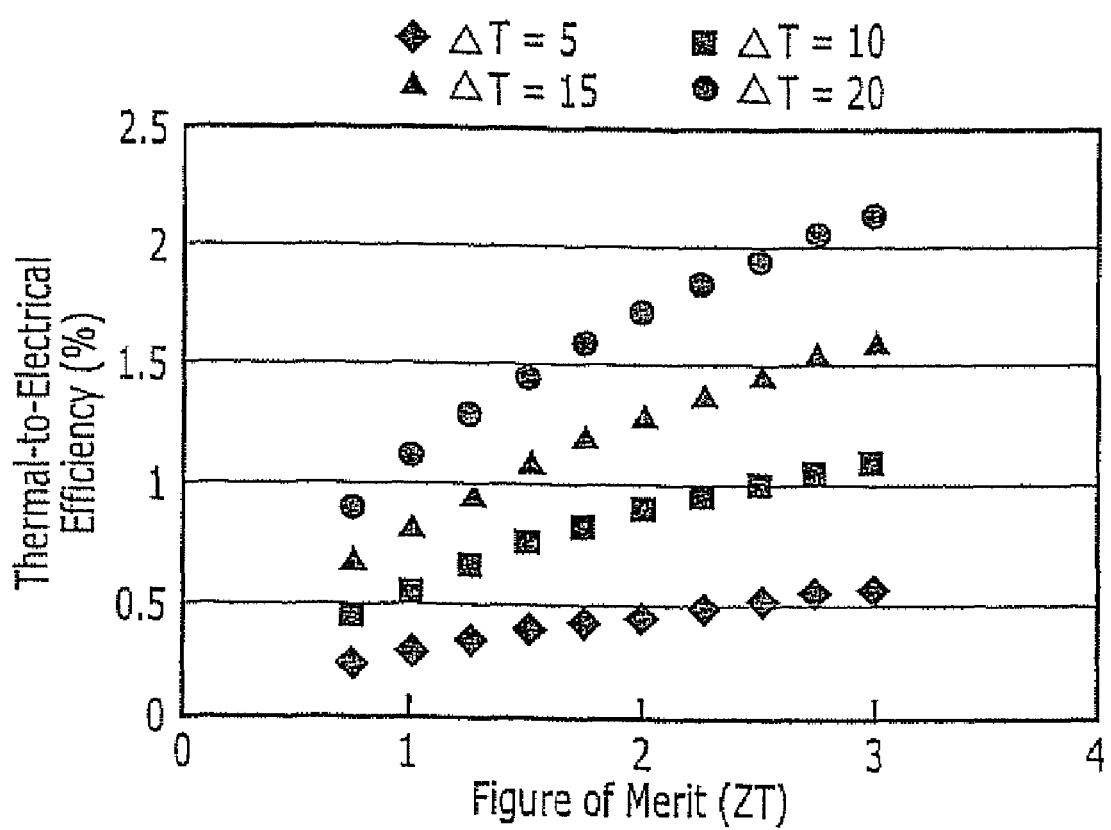

FIG. 19 is a graph illustrating the intrinsic Figure of Merit (intrinsic ZT) for P-type and N-type superlattice thermoelectric materials as a function of temperature, and P-N couples of these materials used for power conversion may provide intrinsic ZT values of about 1.3. The graphs of FIGS. 20 and 21 illustrate dependence of thermal to electric energy conversion efficiency (%) as a function of Figures of Merit (ZT) at different temperatures differences ($\Delta T$) across the P-type and N-type thermoelectric elements. Thin film superlattice thermoelectric elements may thus be used to provide solar-to-electric energy conversion at efficiencies in the range of about 5% to about 7% using temperature differences ($\Delta T$) across the thermoelectric elements in the range of about 50 K to about 80 K.

According to embodiments of the present invention, thermoelectric solar power converters may be provided with a relatively low packing fractions of thermoelectric material relative to a surface area of the thermally conductive plate used to collect solar radiation. Compared with a conventional photovoltaic solar collector, a reduction in electronic grade semiconductor material and/or an increase in power generation may be provided. For example, an array of P-N thermoelectric couples may be provided on a surface of a thermally conductive plate used to absorb solar energy, with the thermally conductive plate having a surface area of about 200 cm$^2$ and with a total combined area of the thermoelectric elements of about 2 cm$^2$, to provide a packing fraction of about 1%. The relatively low packing fraction may both reduce a cost of the thermoelectric solar power converter, and increase an efficiency of operation by increasing a temperature differential ($\Delta T$) across the thermoelectric elements.

In addition, thermoelectric elements may be provided with relatively high figures of merit (ZT) at temperatures in the range of about 300 K to about 400K, and a temperature differential ($\Delta T$) across the thermoelectric elements may be about 50 K. With a collector surface area of 200 cm$^2$ and a combined area of thermoelectric elements of 2 cm$^2$, electric power on the order of one watt may be provided. Moreover, power generation may be provided at night if radiative cooling can be provided.

Themoelectric power conversion according to embodiments of the present invention may be used to generate electricity using heat from an internal combustion engine, such as the engine of an automobile. Heat from a radiator and/or exhaust may be used by a thermoelectric power converter to generate electricity that is used to charge the battery. For example, a hot plate of a thermoelectric power generator according to embodiments of the present invention may be heated using radiator and/or exhaust heat, and a clod plate of the thermoelectric power generator may be cooled by air using heat dissipating fins. For example, a thermoelectric power generator providing 7% efficiency at a temperature differential of about 60 K (with a cold side at about 25 degrees C. and a hot side at about 85 degrees C.) and a module ZT of about 1.9 may be suitable to recover power from radiator heat in an automobile. A two-stage bulk couple cascaded with a superlattice mini-module may provide an efficiency of power conversion greater than about 18% with a cold side at about 25 degrees C. and a hot side at about 700 degrees C., and may be suitable to recover power from exhaust heat in an automobile.

While the present invention has been particularly shown and described with reference to embodiments thereof, it will be understood by those of ordinary skill in the art that various changes in form and details may be made therein without departing from the spirit and scope of the present invention as defined by the following claims.

That which is claimed is:

1. A thermoelectric generator comprising:
   a first thermally conductive plate;
   a second thermally conductive plate, wherein the first and second thermally conductive plates are spaced apart wherein the second thermally conductive plate provides thermal coupling to a temperature stable thermal mass;
   a plurality of pairs of P-type and N-type thermoelectric elements wherein the P-type and N-type thermoelectric elements of each pair are electrically coupled in series, and wherein the P-type and N-type thermoelectric elements of each pair are thermally coupled in parallel between the first and second thermally conductive plates; and
   a transparent cover spaced apart from the first thermally conductive plate, wherein the first thermally conductive plate is between the transparent cover and the plurality of pairs of P-type and N-type thermoelectric elements, wherein a space between the transparent cover and the first thermally conductive plate provides thermal isolation for the first thermally conductive plate, wherein the transparent cover is transparent with respect to solar radiation, and wherein the transparent cover is transparent with respect to heat radiated from the first thermally conductive plate;
   wherein the first thermally conductive plate is configured generate heat responsive to solar radiation received through the transparent cover during daylight operation so that heat flows from the first thermally conductive plate to the second thermally conductive plate to thereby generate a first electric current according to the Seebeck effect, and
   wherein the first thermally conductive plate is configured to radiate heat through the transparent cover during nighttime operation so that heat flows from the second thermally conductive plate to the first thermally conductive plate to thereby generate a second electric current according to the Seebeck effect wherein the second electric current is reversed relative to the first electric current.

2. A thermoelectric generator according to claim 1 wherein the pairs of P-type and N-type thermoelectric elements are spaced apart.

3. A thermoelectric generator according to claim 1 wherein the first thermally conductive plate comprises a first surface in thermal contact with the P-type and N-type thermoelectric elements and a second surface opposite the P-type and N-type thermoelectric elements, wherein the second surface is configured to generate heat responsive to solar radiation incident thereon.

4. A thermoelectric generator according to claim 3 wherein the first and second surfaces are substantially planar.

5. A thermoelectric generator according to claim 1 wherein the temperature stable thermal mass comprises at least one of subterranean soil, subterranean water, and/or subterranean rock.

6. A thermoelectric generator according to claim 1 wherein the P-type and N-type thermoelectric elements comprise P-type and N-type $Bi_2Te_3$ thermoelectric elements.

7. A thermoelectric generator according to claim 6 wherein each of the P-type and N-type $Bi_2Te_3$ thermoelectric element comprises a superlattice of $Bi_2Te_3$ and $Sb_2Te_3$.

8. A thermoelectric generator according to claim 1 wherein the space between the transparent cover and the first thermally conductive plate is sealed from an environment adjacent a surface of the transparent cover opposite the first thermally conductive plate.

9. A thermoelectric generator according to claim 8 wherein a vacuum is maintained in the space between the transparent cover and the first thermally conductive plate.

10. A thermoelectric generator according to claim 1 further comprising:
    an electrical load coupled to the plurality of pairs of P-type and N-type thermoelectric elements.

11. A thermoelectric generator according to claim 10 wherein the electrical load comprises a battery charging circuit, a battery, an electronic circuit, a regulator, and/or a converter.

12. A thermoelectric generator according to claim 1 wherein a packing fraction of the P-type and N-type thermoelectric elements relative to the first thermally conductive plate is less than about 10 percent.

13. A thermoelectric generator according to claim 12 wherein a packing fraction of the P-type and N-type thermoelectric elements relative to the first thermally conductive plate is less than about 1 percent.

14. A thermoelectric generator according to claim 13 wherein a packing fraction of the P-type and N-type thermoelectric elements relative to the first thermally conductive plate is less than about 0.5 percent.

* * * * *